United States Patent
Ahn

(10) Patent No.: US 9,041,071 B2
(45) Date of Patent: May 26, 2015

(54) UNIT PIXEL OF IMAGE SENSOR AND IMAGE SENSOR INCLUDING THE SAME

(71) Applicant: SAMSUNG ELECTRONICS CO., LTD., Suwon-si, Gyeonggi-do (KR)

(72) Inventor: Jung-Chak Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/738,134

(22) Filed: Jan. 10, 2013

(65) Prior Publication Data

US 2013/0221410 A1    Aug. 29, 2013

(30) Foreign Application Priority Data

Feb. 27, 2012    (KR) .................. 10-2012-0019437

(51) Int. Cl.
H01L 27/148 (2006.01)
H01L 31/062 (2012.01)
H04N 3/14 (2006.01)
H01L 31/0232 (2014.01)
H01L 31/09 (2006.01)
H01L 27/146 (2006.01)

(52) U.S. Cl.
CPC ............. *H01L 31/0232* (2013.01); *H01L 31/09* (2013.01); *H01L 27/14614* (2013.01); *H01L 27/14627* (2013.01); *H01L 27/1463* (2013.01); *H01L 27/1464* (2013.01)

(58) Field of Classification Search
CPC . H01L 31/0232; H01L 31/09; H01L 27/1464; H01L 27/14627
USPC .............. 257/225, 292.29; 348/294, 302
See application file for complete search history.

(56) References Cited

U.S. PATENT DOCUMENTS

| 7,608,872 | B2 | 10/2009 | Kim | |
| 2008/0290382 | A1* | 11/2008 | Hirota | 257/291 |
| 2009/0104851 | A1* | 4/2009 | Cherian et al. | 451/36 |
| 2009/0303371 | A1 | 12/2009 | Watanabe et al. | |
| 2010/0025738 | A1 | 2/2010 | Kohyama | |
| 2010/0117126 | A1* | 5/2010 | Takahashi | 257/292 |

(Continued)

FOREIGN PATENT DOCUMENTS

| JP | 2010-040557 | 2/2010 |
| JP | 2010-114274 | 5/2010 |

(Continued)

*Primary Examiner* — Chuong A Luu
*Assistant Examiner* — Moazzam Hossain
(74) *Attorney, Agent, or Firm* — Volentine & Whitt, PLLC

(57) ABSTRACT

A unit pixel of an image sensor includes a photoelectric conversion region, an isolation region, a floating diffusion region and a transfer gate. The photoelectric conversion region is formed in a semiconductor substrate. The isolation region surrounds the photoelectric conversion region, extends substantially vertically with respect to a first surface of the semiconductor substrate, and crosses the incident side of the photoelectric conversion region so as to block leakage light and diffusion carriers. The floating diffusion region is disposed in the semiconductor substrate above the photoelectric conversion region. The transfer gate is disposed adjacent to the photoelectric conversion region and the floating diffusion region, extends substantially vertically with respect to the first surface of the semiconductor substrate, and transmits the photo-charges from the photoelectric conversion region to the floating diffusion region.

15 Claims, 20 Drawing Sheets

(56) References Cited

U.S. PATENT DOCUMENTS

| | | |
|---|---|---|
| 2010/0193845 A1 | 8/2010 | Roy et al. |
| 2010/0237451 A1* | 9/2010 | Murakoshi ............... 257/432 |
| 2011/0062561 A1* | 3/2011 | Akiyama et al. ........... 257/637 |
| 2011/0108939 A1* | 5/2011 | Marty et al. ............. 257/432 |
| 2011/0133061 A1* | 6/2011 | Yu et al. ................ 250/214.1 |
| 2011/0155893 A1* | 6/2011 | Endo et al. .............. 250/208.1 |
| 2011/0156186 A1* | 6/2011 | Iida et al. ............... 257/432 |
| 2012/0043589 A1* | 2/2012 | Nozaki et al. ............ 257/225 |
| 2012/0188397 A1* | 7/2012 | Ohta .................... 348/222.1 |

FOREIGN PATENT DOCUMENTS

| | | |
|---|---|---|
| KR | 10-0745542 | 8/2007 |
| KR | 0748342 B1 | 8/2007 |

\* cited by examiner

UNIT PIXEL OF IMAGE SENSOR AND IMAGE SENSOR INCLUDING THE SAME

PRIORITY STATEMENT

This application claims priority under 35 USC §119 to Korean Patent Application No. 2012-0019437, filed on Feb. 27, 2012 in the Korean Intellectual Property Office (KIPO), the contents of which are hereby incorporated by reference in their entirety.

BACKGROUND

1. Technical Field

The inventive concept relates generally to image sensors. More particularly, the inventive concept relates to unit pixels of image sensors, and to back-side illuminated image sensors including unit pixels.

2. Description of the Related Art

An image sensor is a device that transforms incident light to an electric signal. A charge coupled device (CCD) image sensor and a complementary metal oxide semiconductor (CMOS) image sensor are examples of different types of image sensors. To improve their sensing performance, either of these types of image sensor may be configured as a back-side illuminated image sensor (BIS). A BIS performs photoelectric transformation of incident light passing through a back surface of a semiconductor substrate.

SUMMARY

According to one aspect of the inventive concept, there is provided a pixel unit comprising a semiconductor substrate having first and second opposite major surfaces at upper and lower portions thereof, respectively, a photoelectric conversion region located between the first and second surfaces and which generates charges from incident light, and an isolation region surrounding the photoelectric conversion region and extending substantially vertically in the axial direction away from the first surface of the semiconductor substrate beyond the photoelectric conversion region such that the isolation region extends to a depth in the semiconductor substrate greater than that to which the photoelectric conversion region extends relative to the first surface of the substrate, and a transfer gate extending substantially vertically in the axial direction away from the first surface of the semiconductor substrate to a location adjacent the photoelectric conversion region. The transfer gate is disposed adjacent to a floating diffusion region so as to transmit the charges from the photoelectric conversion region to the floating diffusion region.

According to another aspect of the inventive concept, in a pixel unit having a photoelectric conversion region, a floating diffusion region, and at least one transistor, the floating diffusion region and the at least one transistor are disposed above the photoelectric conversion region in the pixel unit, and a transfer gate is disposed adjacent to the floating diffusion region and extends substantially vertically in the pixel unit to a location adjacent the photoelectric conversion unit.

According to still another aspect of the inventive concept, there is provided an image sensor comprising an array of pixels that generates electric signals from light incident thereon, and a signal processing unit operatively connected to the pixel array and configured to generate image data based on the electric signals, and in which each of the pixels of the array has a photoelectric conversion region located within a semiconductor substrate and which generates charges corresponding to incident light received thereby, an isolation region surrounding the photoelectric conversion region and extending substantially vertically with respect to a first surface of the semiconductor substrate, a floating diffusion region within the semiconductor substrate and disposed above the photoelectric conversion region, and a transfer gate extending substantially vertically away from the first surface of the semiconductor substrate to a location adjacent the photoelectric conversion region. The transfer gate is disposed adjacent to the floating diffusion region so as to transmit charges from the photoelectric conversion region to the floating diffusion region.

BRIEF DESCRIPTION OF THE DRAWINGS

The inventive concept will be more clearly understood from the following detailed description of the preferred embodiments made in conjunction with the accompanying drawings.

DETAILED DESCRIPTION OF THE PREFERRED EMBODIMENTS

Figure 1:
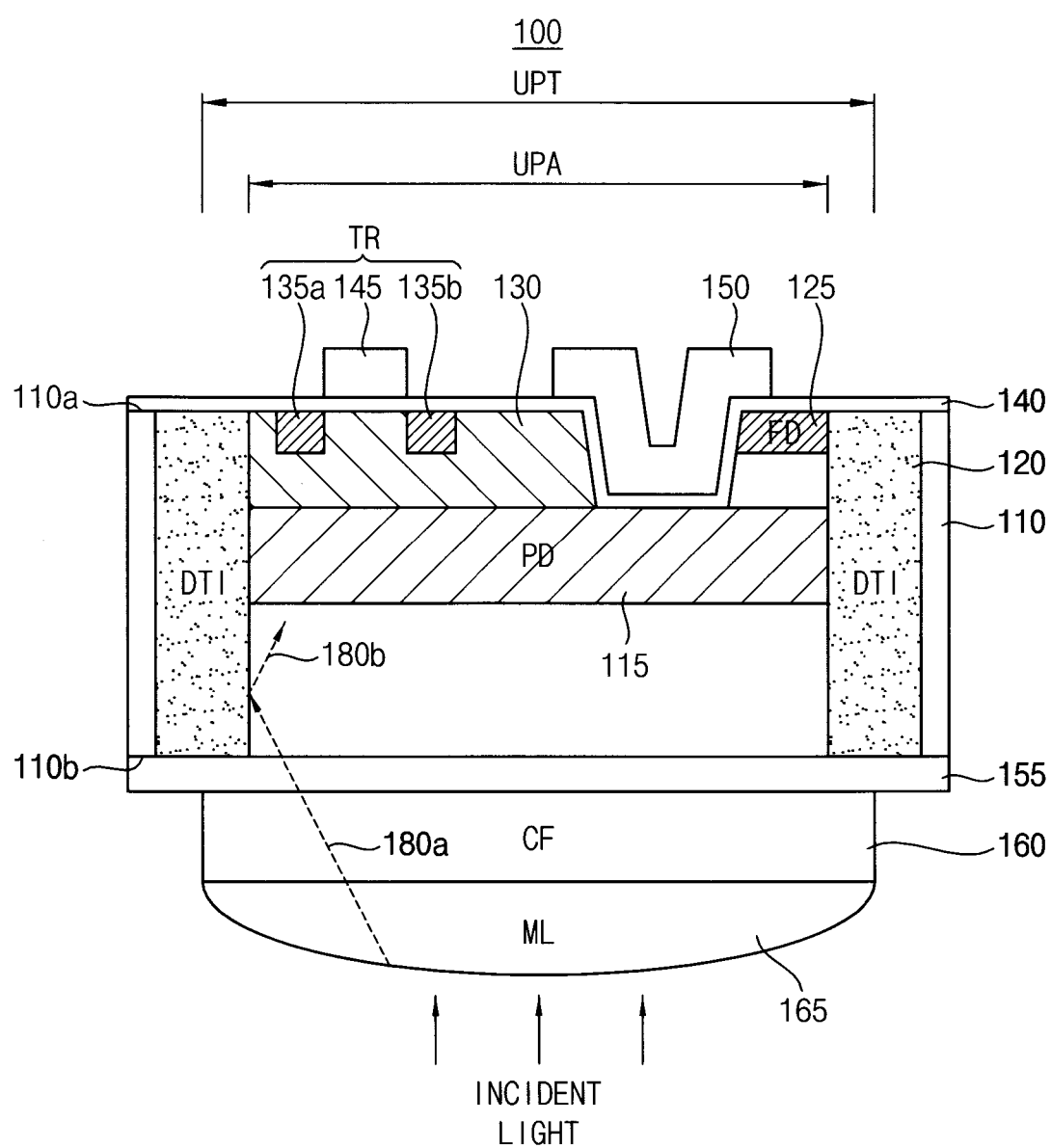
FIG. 1 is a cross-sectional view of a unit pixel of an image sensor according to the inventive concept.

Various embodiments and examples of embodiments of the inventive concept will be described more fully hereinafter with reference to the accompanying drawings. In the drawings, the sizes and relative sizes and shapes of elements, layers and regions, shown in section may be exaggerated for clarity. In particular, the cross-sectional illustrations of the unit pixels and intermediate structures fabricated during the course of their manufacture are schematic. Also, like numerals are used to designate like elements throughout the drawings.

Furthermore, spatially relative terms, such as "upper," "lower", "above," and "below" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. The terms "depth", "thickness" and "height" will be understood as referring to dimensions all in the same direction, namely, a vertical direction in the figures or axial direction of the pixel unit. The term "substrate" may be understood at times to refer merely to an original portion of the substrate which remains unaltered after various other regions of the substrate have been altered by implantation processes or the like.

It will also be understood that when an element or layer is referred to as being "on" (or "below") another element or layer, it can be directly on (or below) the other element or layer or intervening elements or layers may be present. In contrast, when an element or layer is referred to as being "directly on" (or "directly below") another element or layer, there are no intervening elements or layers present.

Furthermore, as used herein, the term "and/or" includes any and all practical combinations of one or more of the associated listed items.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "unit pixel" will be understood as generally synonymous with the term "pixel unit" or simply what may be considered a pixel by those skilled in the art. Also, the term "semiconductor substrate" may refer to an original region or layer of semiconductor material, such as an original region of an epitaxial layer containing impurities, which is processed to form the pixel unit.

A unit pixel 100 of an image sensor according to the inventive concept will be described in detail with reference to FIGS. 1 and 2. The image sensor may be any of various types of image sensors, e.g., a complementary metal-oxide semiconductor (CMOS) image sensor or a charge-coupled device (CCD) image sensor. Hereinafter, reference will be made to a CMOS image sensor as an example of the image sensor comprising unit pixel 100.

The unit pixel 100 has a photoelectric conversion region (PD) 115, an isolation region (DTI) 120, a floating diffusion region (FD) 125 and a transfer gate 150 that are formed in a semiconductor substrate 110. The unit pixel 100 of the image sensor may also have a first impurity region 130, a second impurity region 135a, a third impurity region 135b, a first dielectric layer 140, a first gate 145, a second dielectric layer 155, a color filter (CF) 160 and a micro lens (ML) 165.

The semiconductor substrate 110 has a front surface 110a and a back surface 110b. The unit pixel 100 may be included in a backside illuminated image sensor (BIS) that generates image data in response to incident light passing through the back surface 110b of the semiconductor substrate 110. The semiconductor substrate 110 may include an epitaxial layer (not shown) and may be doped with, for example, p-type impurities.

In this example of a BIS including the unit pixel 100, a plurality of gate structures 145, 150, which transfer and amplify electric signals corresponding to the incident light, are disposed on the front surface 110a of the semiconductor substrate 110. The color filter 160 and the micro lens 165, through which the incident light passes, are disposed on the back surface 110b of the semiconductor substrate 110. In the BIS, because the gate structures and metal lines connected to the gate structures are not disposed between the micro lens 165 and the photoelectric conversion region 115, the incident light is not diffused and/or scattered significantly by the gate structures 145, 150 and the metal lines, and the distance from the micro lens 165 to the photoelectric conversion region 115 is relatively short. Accordingly, a BIS has a relatively high degree of light guiding efficiency and optical sensitivity.

The photoelectric conversion region 115 is formed in the semiconductor substrate 110. The photoelectric conversion region 115 may be formed in a unit pixel area UPA of the semiconductor substrate 110. In comparison with a conventional photoelectric conversion region of a conventional unit pixel, the photoelectric conversion region 115 is formed relatively deeply with respect to the front surface 110a of the semiconductor substrate 110, and may have a relatively large footprint in the semiconductor substrate 110. In other words, the photoelectric conversion region 115 may be spaced a predetermined distance from the front surface 110a, and may present a relatively large area that receives the incident light.

A region of the semiconductor substrate 110 left between the photoelectric conversion region 115 and the back surface 110b will be referred to as a transmitting region of the substrate 110 and is substantially transparent to the incident light (of a given wavelength(s)) such that the incident light is transmitted by the transmitting region to the photoelectric conversion region 115 in the unit pixel.

The photoelectric conversion region 115 is configured to generate photo-charges corresponding to the intensity of the incident light. For example, the photoelectric conversion region 115 may generate electron-hole pairs in response to the incident light, and may collect the electrons and/or the holes of the electron-hole pairs. To this end, the photoelectric conversion region 115 may comprise a photo diode, a photo transistor, a photo gate, a pinned photo diode (PPD) or a combination of such components.

The isolation region 120 surrounds the photoelectric conversion region 115. For example, the isolation region 120 may occupy an outer peripheral portion of the semiconductor substrate 110. The outer peripheral portion may be the whole area UPT other than the unit pixel area UPA. The isolation region 120 is formed substantially vertically with respect to a first surface, e.g., the front surface 110a, of the semiconductor substrate 110. The isolation region 120 extends to a depth greater than that to which the photoelectric conversion region 115 extends, relative to the front surface 110a. In comparison with a conventional isolation region of the conventional unit pixel, the isolation region 120 is relatively deep, i.e., is akin to a deep trench structure. The isolation region 120 is configured to block leakage light and diffusion carriers from the photoelectric conversion region 115.

In an example of this embodiment, the isolation region 120 consists of dielectric material whose refractive index is lower than the refractive index of the semiconductor substrate 110.

For example, when the semiconductor substrate 110 is a silicon substrate and the isolation region 120 is of an oxide, the semiconductor substrate 110 may have a refractive index of about 3.5 and the isolation region 120 may have a refractive index of about 1.5. In this case, although some of the incident light is refracted by the micro lens 165, a leakage component 180a of the incident light may be reflected totally internally at the sidewall surface of the isolation region 120. A reflection component 180b may reach the photoelectric conversion region 115, and thus neighboring unit pixels (not shown) of the image sensor are shielded from the leakage component 180a. In addition, since the isolation region 120 is of dielectric material, the diffusion carriers generated by the incident light may be sufficiently prevented from being transferred to the neighboring unit pixels from the photoelectric conversion region 115.

The isolation region 120 may be formed before or after the transfer gate 150 is formed. Examples of the isolation region 120 will be described with reference to FIGS. 5, 6, 9 and 10.

The floating diffusion region 125 is formed in the semiconductor substrate 110 above the photoelectric conversion region 115. In other words, the floating diffusion region 125 may be formed in an upper portion of the semiconductor substrate 110, and the photoelectric conversion region 115 may be formed in a lower portion of the semiconductor substrate 110. The floating diffusion region 125 may be formed in the unit pixel area UPA of the semiconductor substrate 110. The floating diffusion region 125 receives the photo-charges from the photoelectric conversion region 115 via the transfer gate 150. Thus, image data may be generated based on the number of the photo-charges received, i.e., based on the amount of the charge.

The transfer gate 150 is formed adjacent to the photoelectric conversion region 115 and the floating diffusion region 120, and transmits the photo-charges from the photoelectric conversion region 115 to the floating diffusion region 125. The transfer gate 150 is formed substantially vertically with respect to the first surface, e.g., the front surface 110a, of the semiconductor substrate 110, and thus may be referred to as a vertical gate structure. In the illustrated example, the transfer gate 150 is cup-shaped. Alternatively, the transfer gate 150 may be pillar-shaped. In addition, part of the transfer gate 150 may extend into the photoelectric conversion region 115. The alternative forms of the transfer gate will be described further with reference to FIGS. 7 and 8.

The first, second and third impurity regions 130, 135a, 135b and the first gate 145 form at least one transistor TR of the image sensor. The at least one transistor TR may include a reset transistor for discharging the floating diffusion region 125, a drive transistor for amplifying a voltage of the floating diffusion region 125, and a select transistor for outputting the amplified voltage as the electric signal in response to a select signal. Similarly to the floating diffusion region 125, the impurity regions 130, 135a, 135b may formed in the semiconductor substrate 110 above the photoelectric conversion region 115, and may be formed in the unit pixel area UPA of the semiconductor substrate 110. The gate structures 145, 150 are electrically insulated from the semiconductor substrate 110 by the first dielectric layer 140. Thus, the first dielectric layer 140 may be referred to as a gate dielectric layer.

The unit pixel 100 may be realized in the form of various structures, e.g., a one-transistor structure, a three-transistor structure, a four-transistor structure, or a five-transistor structure. In addition, the unit pixel 100 may be configured to allow some of its transistors to be shared by other unit pixels. The circuitry of the unit pixel and the structure and the operation of the image sensor including the unit pixel will be described in further detail with reference to FIGS. 12 and 13.

The second dielectric layer 155 may be formed on a second surface, e.g., the back surface 110b, of the semiconductor substrate 110. In an example of this embodiment, the second dielectric layer 155 includes negative fixed charges and thus, the image sensor including the unit pixel 100 can effectively reduce dark currents.

The color filter 160 may be formed on the second surface 110b and more specifically, in this example, on the second dielectric layer 155. The color filter 160 is optically aligned with the photoelectric conversion region 115. The color filter 160 may be part of a color filter array of the image sensor, i.e., may be one color filter in a matrix of color filters. For example, the color filter array may be a Bayer filter including red filters, green filters and/or blue filters. In other words, the color filter 160 may be one of the red, green and blue filters of a Bayer filter. Alternatively, the color filter array may include yellow filters, magenta filters, and/or cyan filters. In other words, the color filter 160 may be a yellow, magenta or cyan filter. The color filter array may also be a white filter, according to another example of this embodiment.

The micro lens 165 may be formed on the color filter 160. The micro lens 165 is optically aligned with the photoelectric conversion region 115 and to the color filter 160, respectively. In other words, the micro lens 165 focuses incident light entering the micro lens onto the photoelectric conversion region 115. The micro lens 165 may be part of a micro lens array of the image sensor, i.e., may be one micro lens in a matrix of micro lenses.

Figure 2:
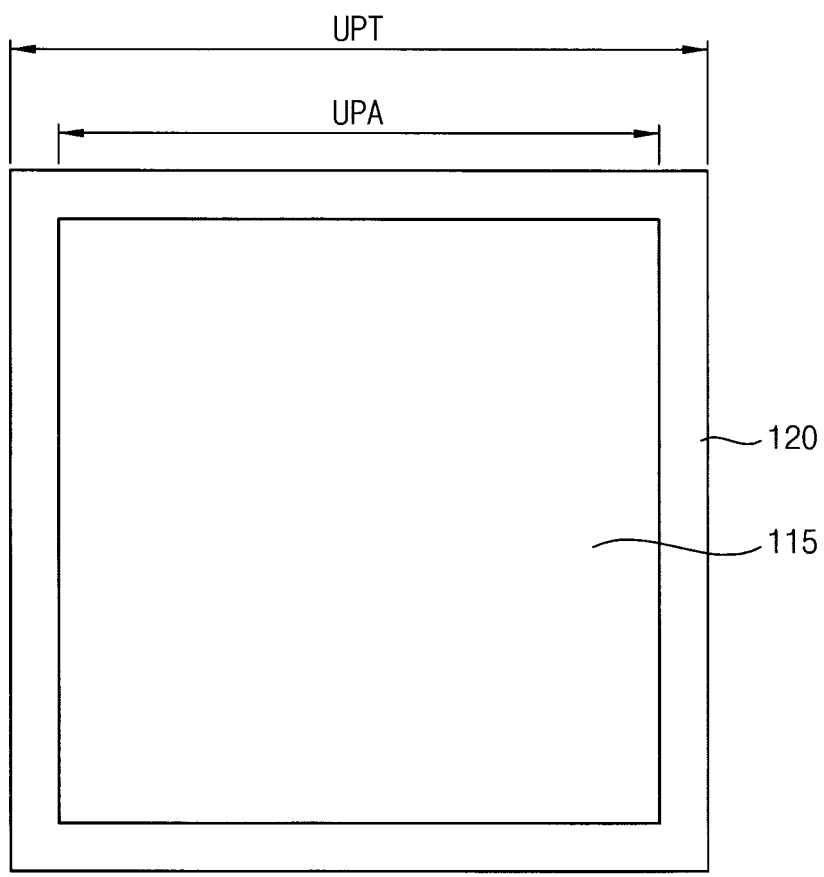
FIG. 2 is a schematic of a layout of regions of the unit pixel of FIG. 1.

Although not illustrated in FIG. 1, an anti-reflection layer may be interposed between the second dielectric layer 155 and the color filter 160. Such an anti-reflection layer can reduce and/or prevent the incident light from being reflected by the back surface 110b of the semiconductor substrate 110. Also, such an anti-reflective layer can be a laminate of alternately disposed materials having different refractive indices.

A third dielectric layer (not shown) may be formed on the gate structures 145, 150, and a plurality of metal lines (also not shown) may be formed in the third dielectric layer. Such metal lines may be electrically connected to the gate structures 145, 150 through contacts and/or plugs.

Typically, a unit pixel of an image sensor includes a photoelectric conversion region, a floating diffusion region and at least one transistor for driving the unit pixel. Such elements in a conventional unit pixel are arranged in a two-dimensional structure. In other words, the photoelectric conversion region, the floating diffusion region and the at least one transistor in the conventional unit pixel may be formed to substantially the same depths in a first surface (e.g., a front surface) of a semiconductor substrate. As the conventional image sensor becomes more highly integrated, the size of the photoelectric conversion region in the conventional unit pixel must be reduced, because the sizes of the floating diffusion region and the transistor have to be maintained to drive the image sensor. Thus, as the conventional image sensor becomes more highly integrated, the ratio of the light-receiving area to the entire surface area of the image sensor, i.e., the so-called fill factor, decreases. In addition, when the incident light has high intensity, a portion of the incident light may arrive at the neighboring unit pixels through reflection, refraction and diffraction, and photo carriers generated by the incident light may diffuse to the neighboring unit pixels such that an undesirable optical and/or electrical crosstalk may occur.

In the above-described unit pixel 100 of the image sensor according to the inventive concept, the photoelectric conversion region 115, the floating diffusion region 125 and the at least one transistor TR are formed in the semiconductor substrate 110, and the photoelectric conversion region 115 is disposed relatively deeply in the semiconductor substrate 110 with respect to the front surface 110a. The floating diffusion region 125 and the at least one transistor TR are formed in the semiconductor substrate 110 above the photoelectric conversion region 115. In other words, the photoelectric conversion region 115, the floating diffusion region 125 and the at least one transistor TR may be arranged three-dimensionally. Thus, the photoelectric conversion region 115 may have a relatively large size irrespective of the sizes of the floating diffusion region 125 and the at least one transistor TR, and the fill factor of the image sensor including the unit pixel 100 may be relatively great. In addition, the transfer gate 150 is formed adjacent to the photoelectric conversion region 115 and the floating diffusion region 120, and is formed substantially vertically with respect to the front surface 110a of the semiconductor substrate 110. Thus, the transfer gate 150 may efficiently transmit the photo-charges from the photoelectric conversion region 115 that is relatively deep within the substrate 110 with respect to the floating diffusion region 125.

According to another aspect of the above-described unit pixel 100 of the image sensor according to the inventive concept, the isolation region 120 surrounds the photoelectric conversion region 115, extends substantially vertically with respect to the front surface 110a of the semiconductor substrate 110, and extends more deeply within the substrate 110 than the photoelectric conversion region 115. In addition, the isolation region 120 may comprise dielectric material whose refractive index is lower than the refractive index of the semiconductor substrate 110. Thus, the isolation region 120 may prevent incident light from leaking to the neighboring unit pixels and the photo carriers from diffusing to the neighboring unit pixels, such that undesirable optical and/or electrical crosstalk may be efficiently prevented. In other words, an image sensor including the unit pixel 100 may possess an improved signal-to-noise ratio (SNR).

An example of a method of fabricating the unit pixel of FIG. 1, according to the inventive concept, will now be described in further detail with reference to FIGS. 3A-3I.

Figure 3A:
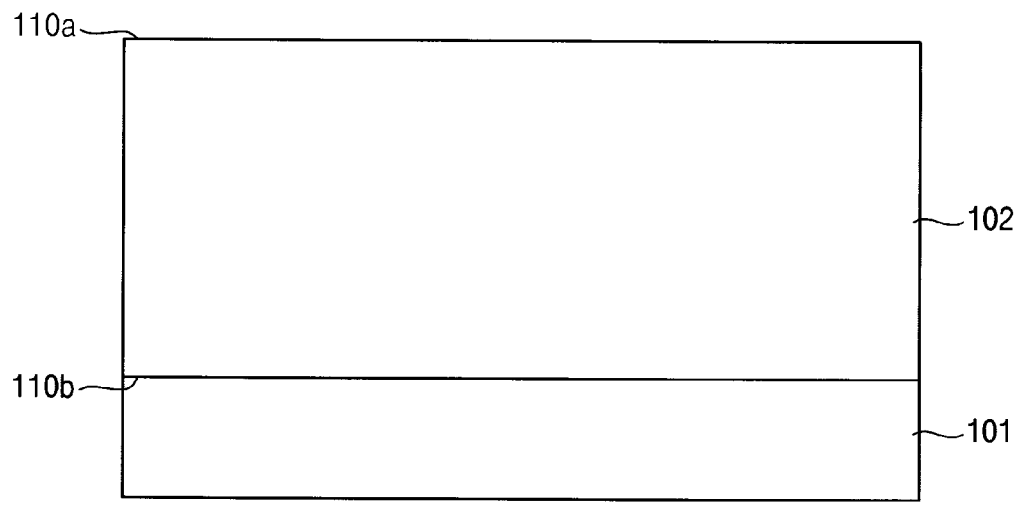
FIGS. 3A, 3B, 3C, 3D, 3E, 3F, 3G, 3H and 3I are cross-sectional views and together illustrate an embodiment of a method of fabricating the unit pixel of FIG. 1, according to the inventive concept.

Referring to FIG. 3A, an epitaxial layer 102 (e.g., a (p−)-type epitaxial layer) may be formed on a bulk silicon substrate 101 (e.g., a (p−)-type bulk silicon substrate). The epitaxial layer 102 may be grown on the bulk silicon substrate 101 using silicon source gas (e.g., silane, dichlorosilane (DCS), trichlorosilane (TCS), or hexachlorosilane (HCS), or a combination thereof). The resultant epitaxial layer 102 constitutes semiconductor substrate 110 (FIG. 3F) having a front surface 110a and a back surface 110b.

Figure 3B:
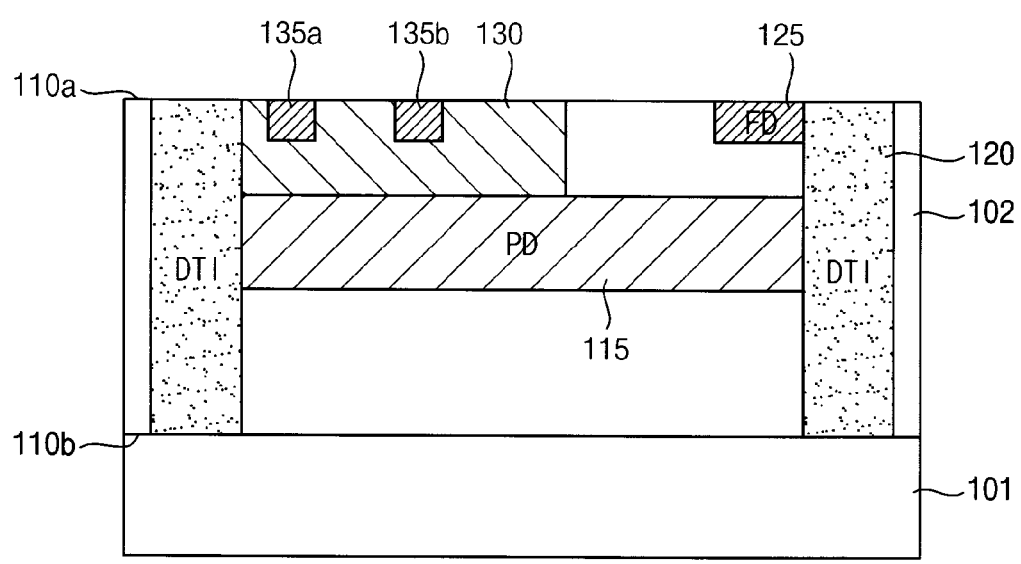

Referring to FIG. 3B, a photoelectric conversion region 115, a floating diffusion region 125, impurity regions 130, 135a, 135b, and an isolation region 120 are formed in the epitaxial layer 102. For example, a region of a conductivity type opposite to that of the epitaxial layer 102 (e.g., n-type region) is formed in the epitaxial layer 102 relatively deeply with respect to the front surface 110a using an ion implantation process such that photoelectric conversion region 115 constituting photo diodes is formed. Similarly, for example, a region of a conductivity type that is the same as that of the epitaxial layer 102 (e.g., p-type region) is formed in the epitaxial layer 102 above the photoelectric conversion region 115 using an ion implantation process to form first impurity region 130. Similarly, for example, regions of a conductivity type opposite to that of the epitaxial layer 102 (e.g., (n+)-type regions) are formed in the epitaxial layer 102 above the photoelectric conversion region 115 using an ion implantation process to form the floating diffusion region 125 and second and third impurity regions 135a, 135b. Also, for example, a region (e.g., dielectric region of a field oxide) is vertically formed in the epitaxial layer 102 from the front surface 110a using a shallow trench isolation (STI) process and/or a local oxidation of silicon (LOCOS) process to form the isolation region 120.

In another example, the photoelectric conversion region 115 is formed of a plurality of doped regions having different conductivity levels of the same type. In this example, an upper doped region is formed by implanting (n+)-type ions in the (p−)-type epitaxial layer 102, and a lower doped region is formed by implanting (n−)-type ions in the (p−)-type epitaxial layer 102.

The isolation region 120 may be formed before or after the photoelectric conversion region 115, the floating diffusion region 125, and the impurity regions 130, 135a, 135b are formed. The isolation region 120 may be formed by repeatedly implanting the dielectric material in the (p−)-type epitaxial layer 102 with different energies. Although not illustrated in FIG. 3B, the isolation region 120 may have an embossed shape as the result of the process of implanting the dielectric material repeatedly but at different energies.

Also, in the example of FIG. 3B, the isolation region 120 is formed in the epitaxial layer 102 to a depth substantially the same as a thickness of the epitaxial layer 102, e.g., throughout the thickness of the semiconductor substrate 110. However, the inventive concept is not so limited and the isolation region 120 may be formed to a depth less than the entire thickness of the semiconductor substrate 110.

Figure 3C:
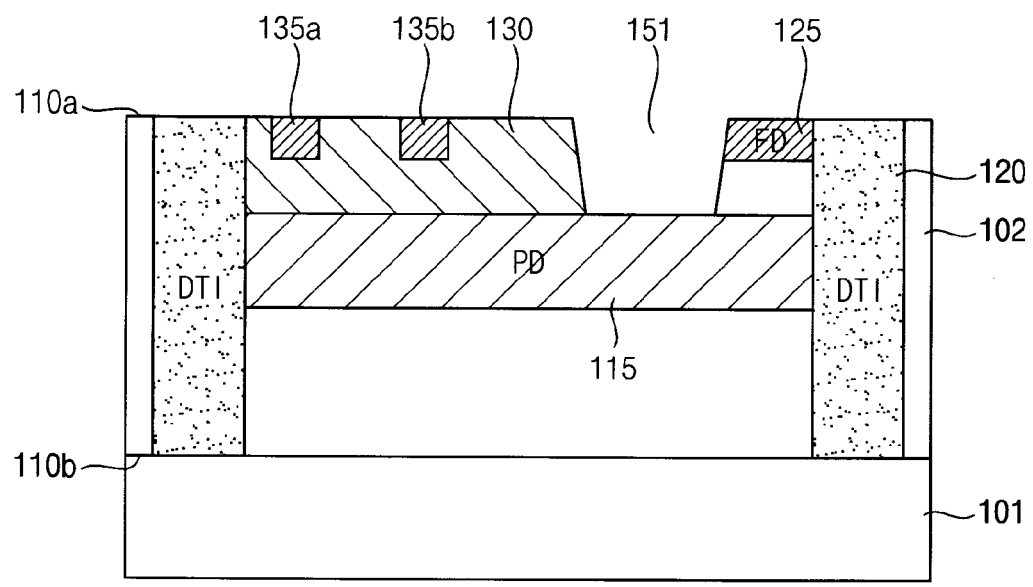

Referring to FIG. 3C, an opening 151 is formed at the front surface 110a of the epitaxial layer 102, e.g., the semiconductor substrate 110. For example, the opening 151 may be formed by etching an upper portion of the epitaxial layer 102 to a predetermined or given depth using a dry etching process and/or a wet etching process. In the example shown in FIG. 3C, the opening 151 is formed from the front surface 110a of the epitaxial layer 102, e.g., the semiconductor substrate 110, to an upper surface of the photoelectric conversion region 115.

Figure 3D:
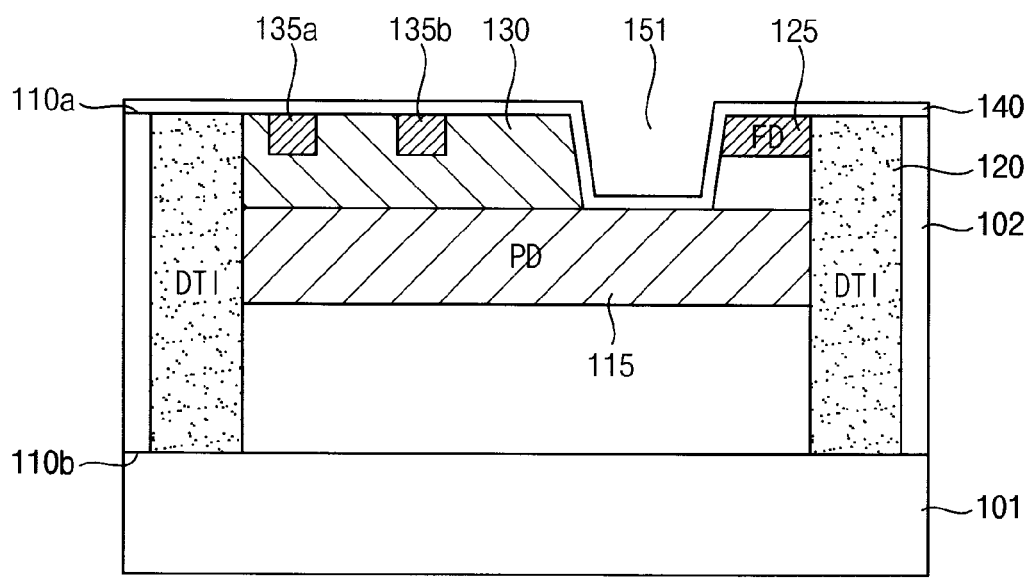

Referring to FIG. 3D, a first dielectric layer 140 may be formed on the front surface 110a of the epitaxial layer 102, e.g., the semiconductor substrate 110. The first dielectric layer 140 may be formed of at least one material selected form the group consisting of silicon oxide (SiOx), silicon oxynitride (SiOxNy), silicon nitride (SiNx), germanium oxynitride (GeOxNy), germanium silicon oxide (GeSixOy), and high-k dielectric materials (e.g., hafnium oxide (HfOx), zirconium oxide (ZrOx), aluminum oxide (AlOx), tantalum oxide (TaOx), hafnium silicate (HfSix), and zirconium silicate (ZrSix)).

Figure 3E:
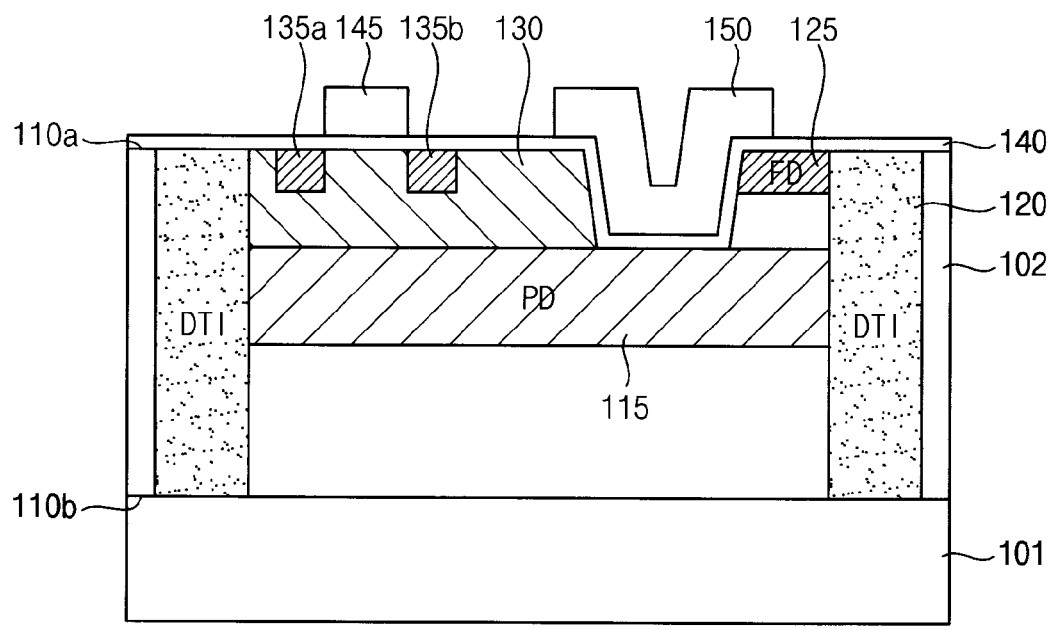

Referring to FIG. 3E, a first gate 145 may be formed on the first dielectric layer 140, and the transfer gate 150 may be formed on the first dielectric layer 140 including within the opening 151. For example, the first gate 145 and the transfer gate 150 may be formed by forming a gate conductive layer on the front surface 110a of the epitaxial layer 102 (e.g., on the first dielectric layer 140), and by patterning the gate conductive layer. The gate conductive layer may be formed of polysilicon, a metal and/or a metal compound.

In an example of the step shown in FIG. 3E, the first gate 145 and the transfer gate 150 are formed simultaneously, i.e., using the same process, and thus the transfer gate 150 has a thickness substantially the same as a thickness of the first gate 145.

Although not illustrated in FIG. 3E, an additional dielectric layer (not shown) may be formed on the first gate 145 and the transfer gate 150, and the additional dielectric layer may include multi-layer metal lines (not shown). The metal lines may be formed by forming a conductive layer of copper, tungsten, titanium and/or aluminum, and by patterning the conductive layer.

Figure 3F:
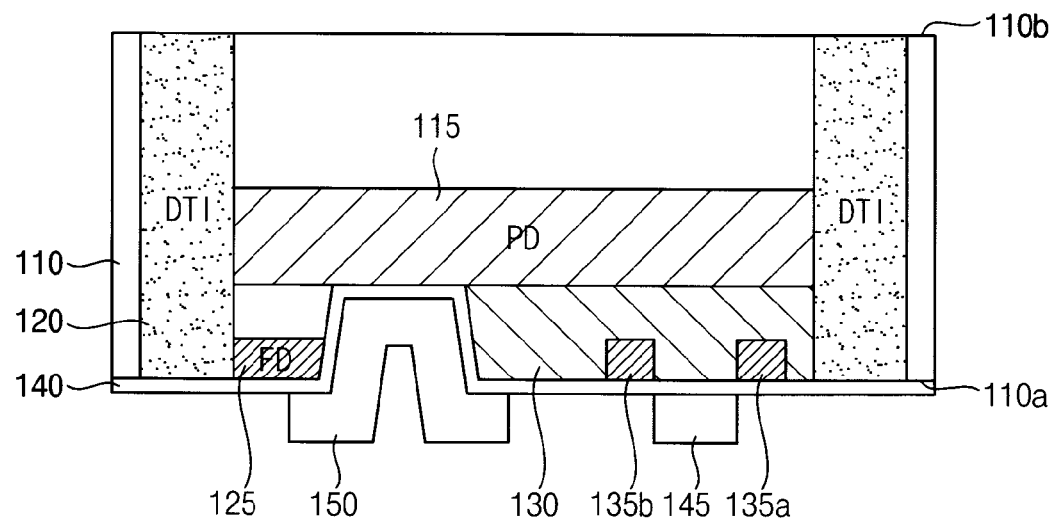

Referring to FIG. 3F, the semiconductor substrate 110 may be formed by removing the bulk silicon substrate 101 on which the epitaxial layer 102 was formed. For example, the bulk silicon substrate 101 is removed by a CMP (chemical mechanical polishing) process and/or a wet etching process. Wet etching reduces contamination of the back surface 110b of the semiconductor substrate 110.

In this example, the bulk silicon substrate 101 is completely removed such that the semiconductor substrate 110 consists of the epitaxial layer 102. An additional semiconductor substrate formed on the first gate 145 and the transfer gate 150 can be provided to support the semiconductor substrate 110.

Figure 3G:
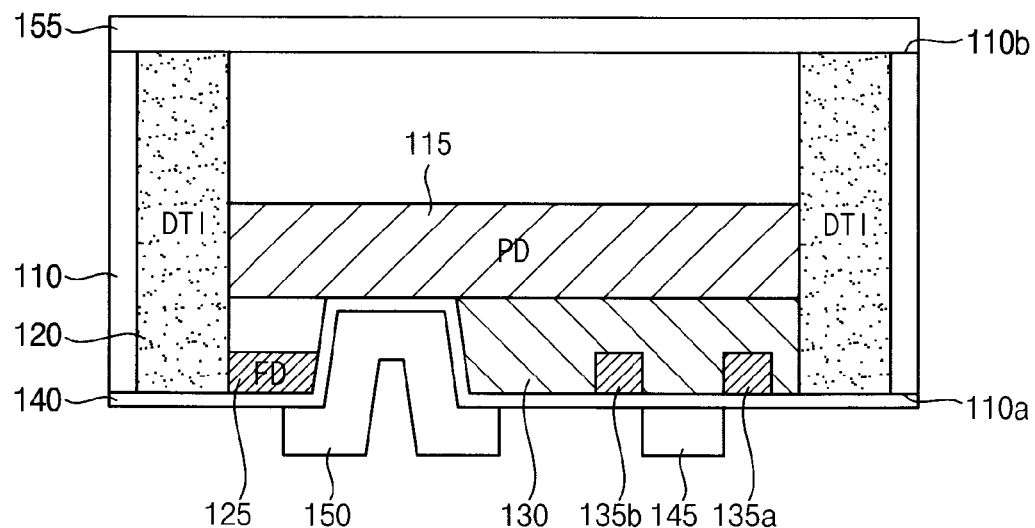

Referring to FIG. 3G, a second dielectric layer 155 is formed on the back surface 110b of the semiconductor substrate 110. In this example, the second dielectric layer 155 contains negative fixed charges. For example, the second dielectric layer 155 may be formed of at least one metal oxide selected from the group consisting of oxides of zirconium (Zr), aluminum (Al), tantalum (Ta), titanium (Ti), and Yttrium (Y) and lanthanoids. Also, the second dielectric layer 155 may have at least one crystallized region.

In the BIS, noise may occur due to surface defects created by, for example, a manufacturing process, in a region adjacent to the back surface 110b of the semiconductor substrate 110. If the second dielectric layer 155 includes the negative fixed charges, the holes may be accumulated in the region adjacent to the back surface 110b of the semiconductor substrate 110. Electric charges generated by surface defects without any incident light may be coupled with the holes accumulated in the region adjacent to the back surface 110b of the semiconductor substrate 110. Thus, dark currents of the image sensor including the unit pixel 100 may be reduced, and light guiding efficiency and light sensitivity may be improved in the image sensor.

In another example, the second dielectric layer 155 may comprise an optical shielding layer (not shown) for preventing and/or reducing incident light from entering an optical black area (not shown).

Figure 3H:
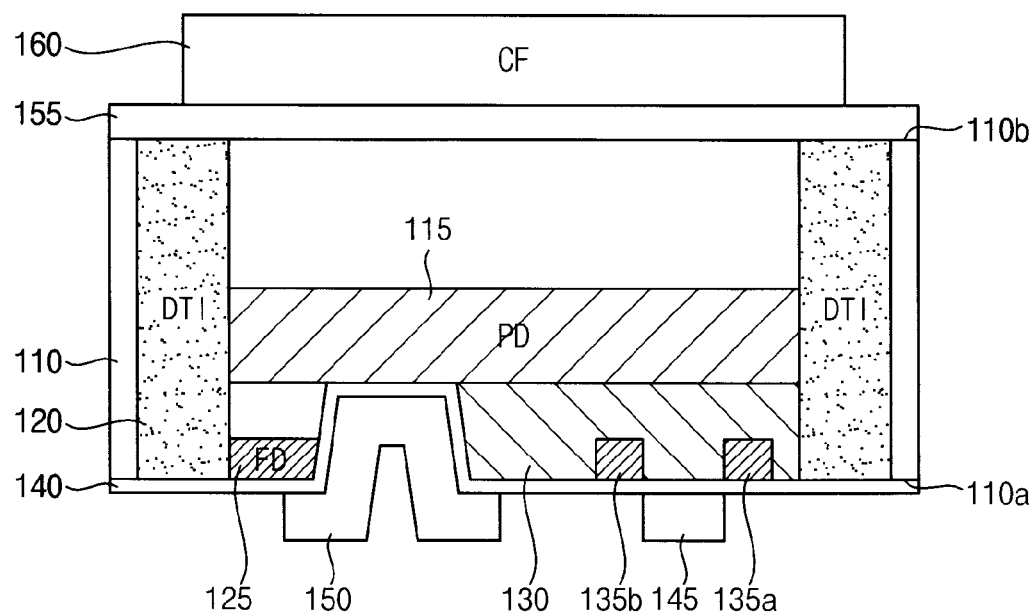

Referring to FIG. 3H, a color filter 160 is formed on the second dielectric layer 155 as optically associated with the photoelectric conversion region 115. The color filter 160 may be formed by coating the second dielectric layer 155 with photosensitive material, e.g., a photo-resist, and by patterning the photosensitive material, e.g., by exposing and developing the photosensitive material using a mask. The patterned photosensitive material may be dyed, or a pigment may be dispersed in the photosensitive material to provide the color of the color filter. Alternatively, the color filter 160 can be formed by a color printing process.

Next, a planarization layer (not illustrated), e.g., an overcoating layer (OCL), may be formed on the color filter 160.

Figure 3I:
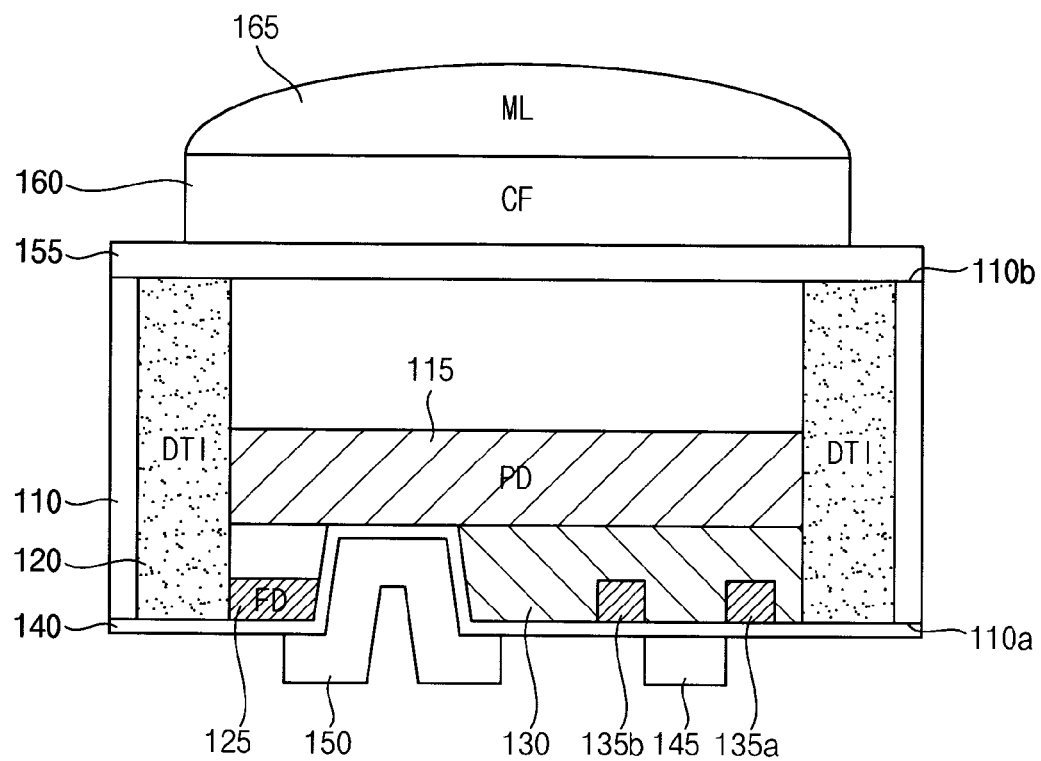

Referring to FIG. 3I, micro lens 165 is formed on the color filter 160 as optically associated with the photoelectric conversion region 115. For example, the micro lens 165 may be formed by forming a layer of transparent photoresist on the color filter 160 and by reflowing the layer so as to be convex. Then, the photoresist is baked to fix the convex shape.

Another example of a method of fabricating the unit pixel of FIG. 1 will be described in detail with reference to FIGS. 4A-4F.

In this example, the steps of forming epitaxial layer 102, second dielectric layer 155, color filter 160, and micro lens 165 may be substantially the same as those illustrated in and described with reference to FIGS. 3A, 3G, 3H and 3I, respectively.

Figure 4A:
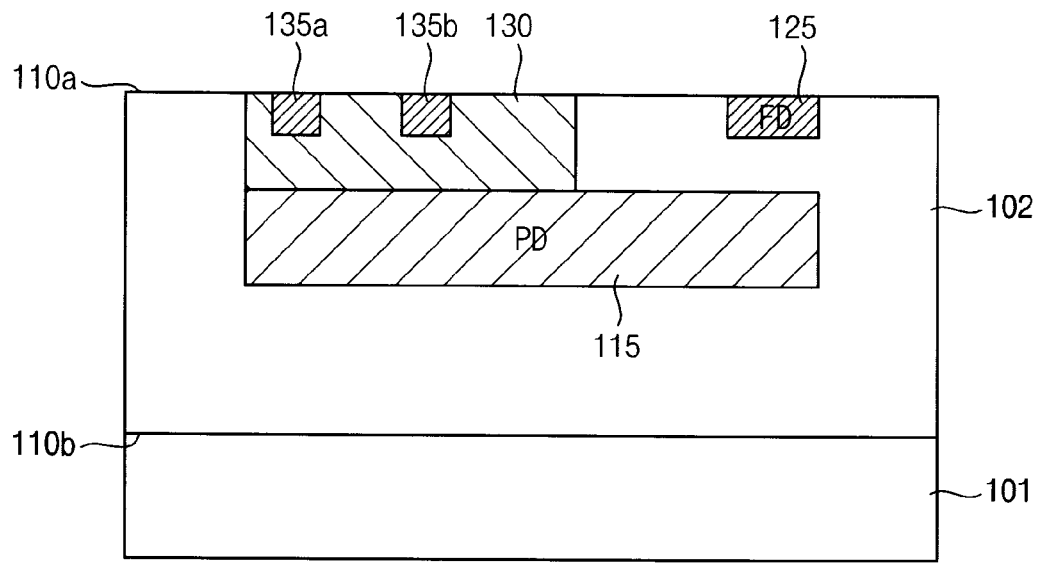
FIGS. 4A, 4B, 4C, 4D, 4E and 4F are cross-sectional views and together illustrate another embodiment of a method of fabricating the unit pixel of FIG. 1, according to the inventive concept.
Figure 4B:
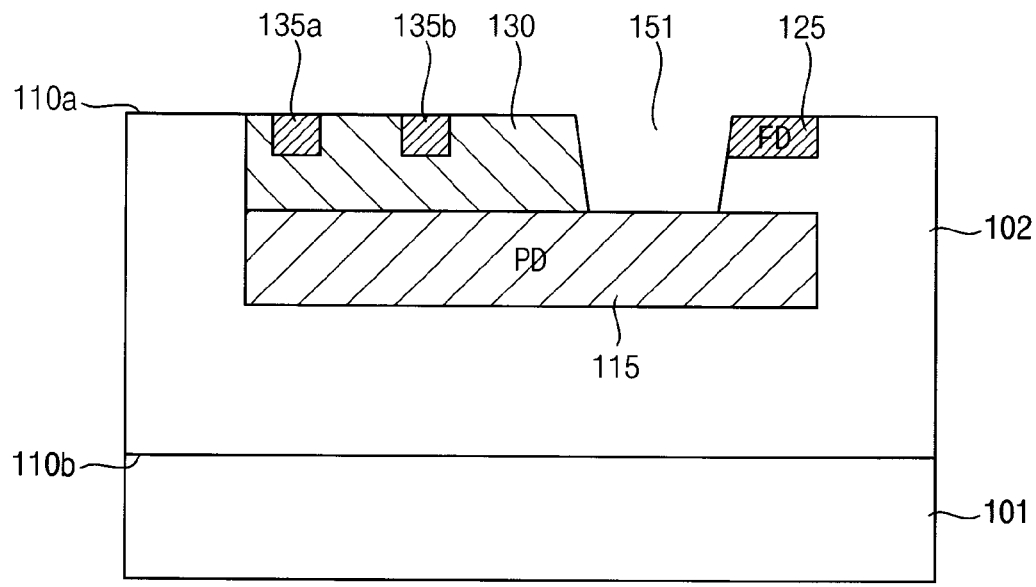
Figure 4C:
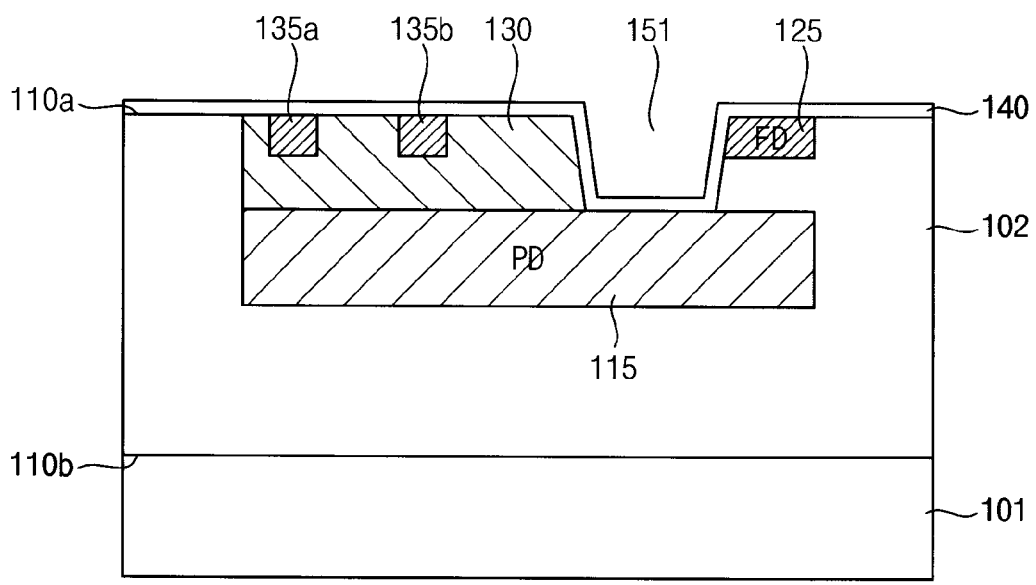
Figure 4D:
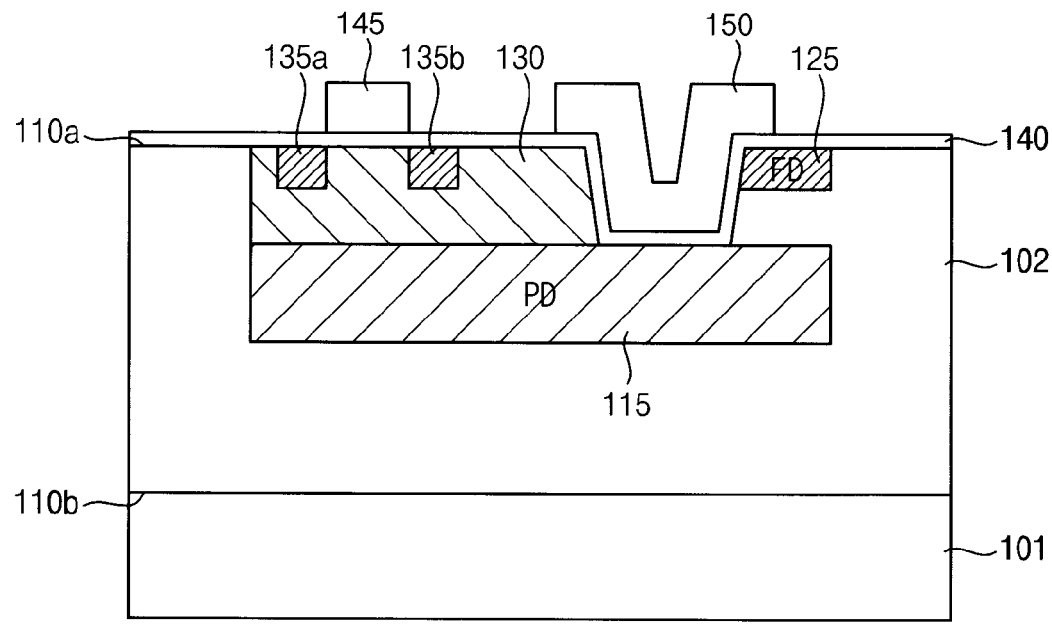
Figure 4E:
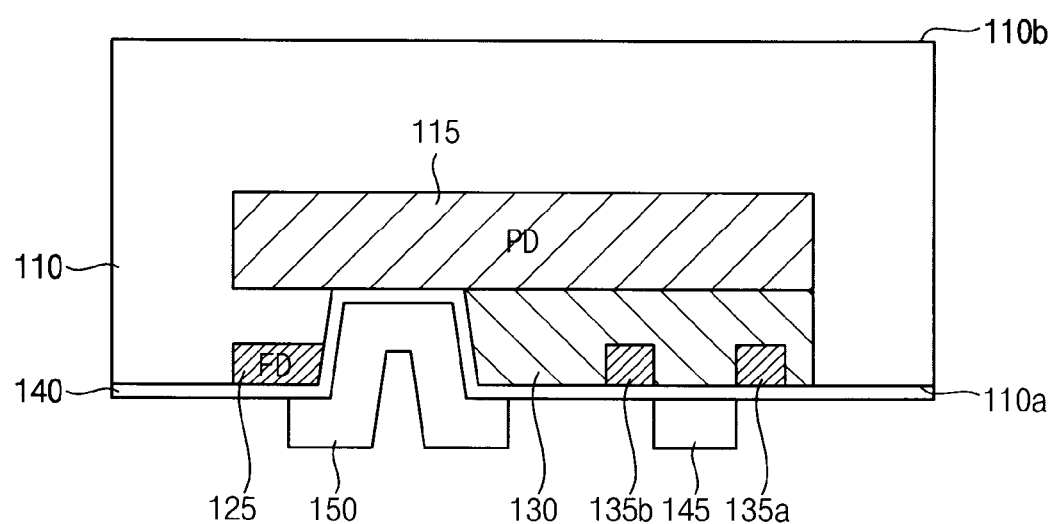

Referring to FIG. 4A, a photoelectric conversion region 115, a floating diffusion region 125, and impurity regions 130, 135a, 135b are formed in the epitaxial layer 102. Referring to FIG. 4B, an opening 151 is formed in the epitaxial layer 102 at the front surface 110a thereof. Referring to FIG. 4C, a first dielectric layer 140 is formed on the front surface 110a of the epitaxial layer 102. Referring to FIG. 4D, a first gate 145 is formed on the first dielectric layer 140, and a transfer gate 150 is formed on the first dielectric layer 140 including within the opening 151. Referring to FIG. 4E, semiconductor substrate 110 may be formed by removing the bulk silicon substrate 101 from the epitaxial layer 102. The processes shown in FIGS. 4A through 4E may be similar to those shown in and described with reference to FIGS. 3B through 3F, respectively, and therefore these processes will not be described again.

Figure 4F:
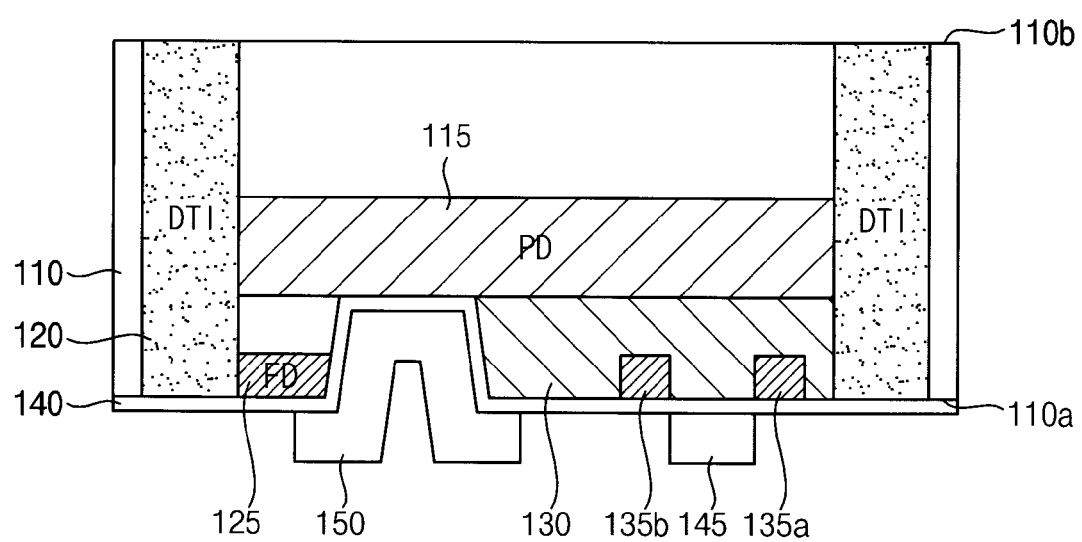

Referring to FIG. 4F, an isolation region 120 is formed in the semiconductor substrate 110. For example, a dielectric of a field oxide is formed vertically in the semiconductor substrate 110 from the back surface 110b thereof using an STI process and/or a LOCOS process.

In the example shown in FIG. 4F, the isolation region 120 is formed in the semiconductor substrate 110 from the back surface 110b to the front surface 110a, such that the depth of the isolation region 120 is substantially the same as the thickness of the semiconductor substrate 110. However, the isolation region 120 may be formed to other depths, according to the inventive concept.

Other examples of a unit pixel of an image sensor according to the inventive concept will now be described with reference to FIGS. 5-11.

Figure 5:
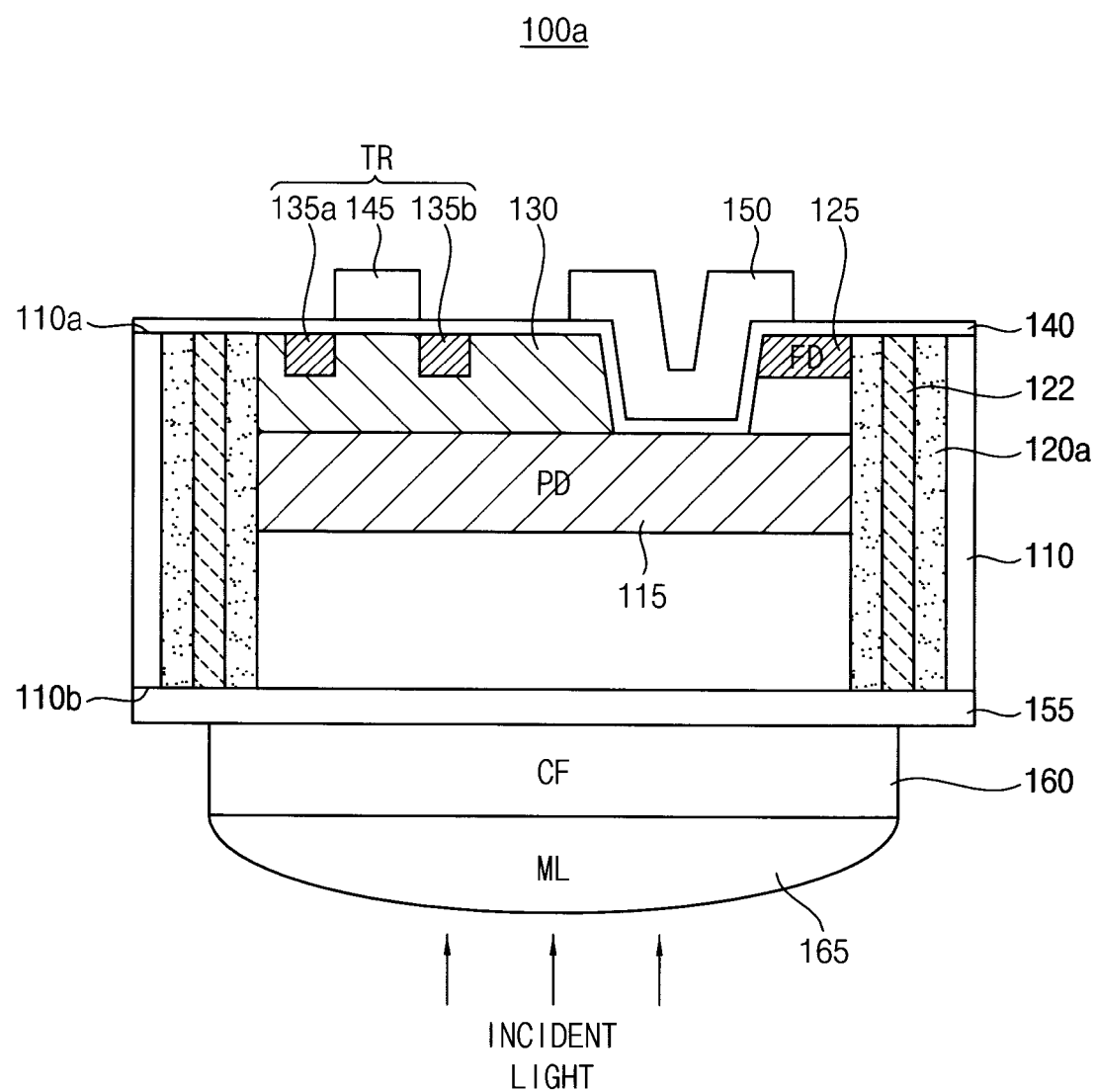
FIG. 5 is a cross-sectional view of another example of a unit pixel of an image sensor according to the inventive concept.

In the example shown in FIG. 5, a unit pixel 100a of an image sensor includes a photoelectric conversion region 115, an isolation region 120a, a floating diffusion region 125 and a transfer gate 150 in a semiconductor substrate 110. The unit pixel 100a of the image sensor further includes a polysilicon region 122, a first impurity region 130, a second impurity region 135a, a third impurity region 135b, a first dielectric layer 140, a first gate 145, a second dielectric layer 155, a color filter 160 and a micro lens 165.

The polysilicon region 122 may comprise polysilicon, a metal and/or a metal compound. The isolation region 120a may surround the polysilicon region 122. The polysilicon region 122 may be formed before or after the isolation region 120a is formed.

Figure 6:
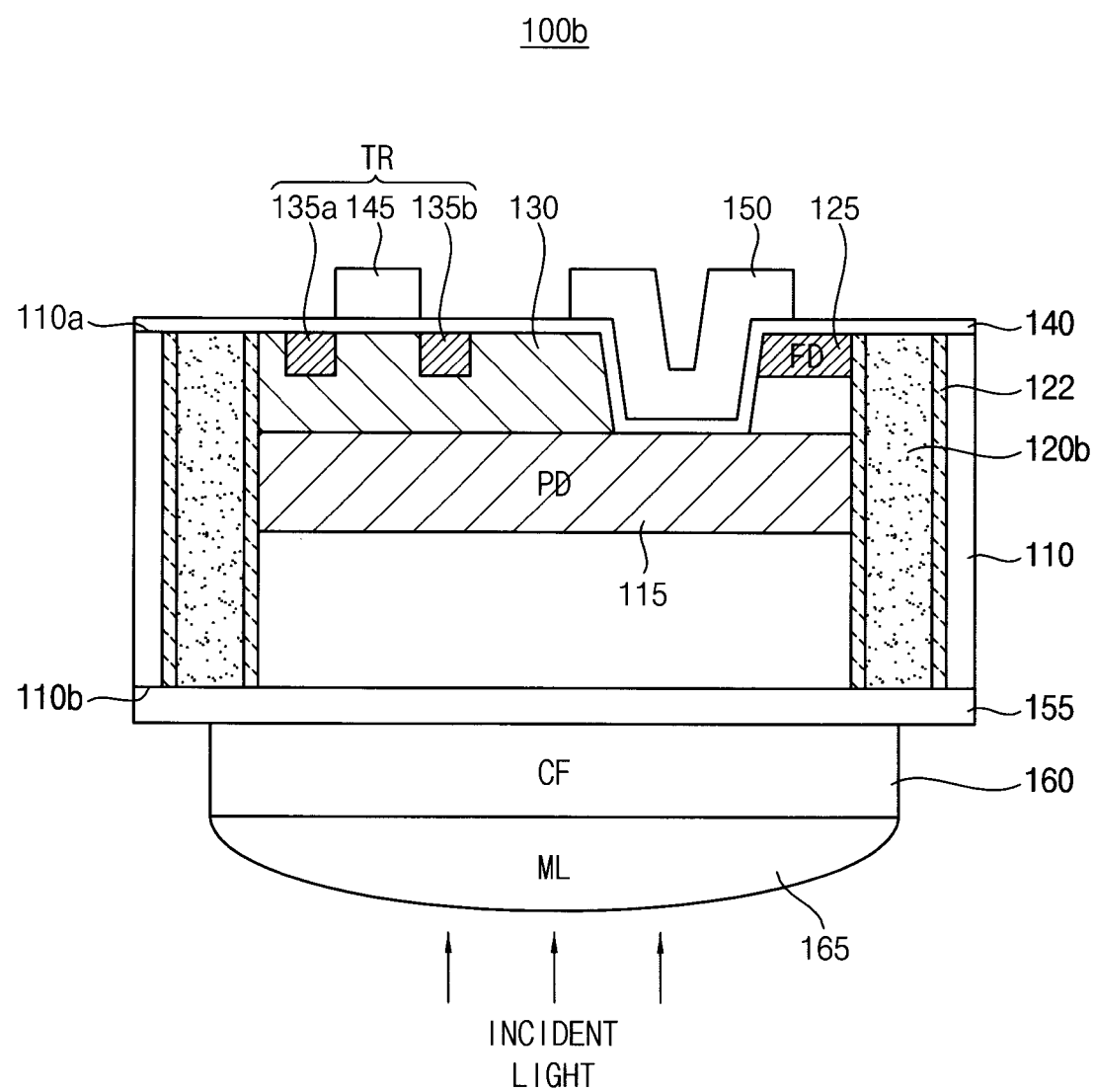
FIG. 6 is a cross-sectional view of another example of a unit pixel of an image sensor according to the inventive concept.

In the example shown in FIG. 6, a unit pixel 100b of an image sensor includes a photoelectric conversion region 115, an isolation region 120b, a floating diffusion region 125 and a transfer gate 150 that are formed in a semiconductor substrate 110. The unit pixel 100b of the image sensor also includes a surface doping layer 122, a first impurity region 130, a second impurity region 135a, a third impurity region 135b, a first dielectric layer 140, a first gate 145, a second dielectric layer 155, a color filter 160 and a micro lens 165.

The surface doping layer 122 surrounds or encases the isolation region 120b. In the case in which the semiconductor substrate 110 contains first conductivity-type (e.g., p-type) impurities, the surface doping layer 122 contains the first-type impurities but at a higher density (concentration) than the semiconductor substrate 110. The isolation region 120b and surface doping layer 122 may be formed by, for example, filling a portion of the semiconductor substrate 110 with dielectric material to first form the isolation region 120b, and then forming the surface doping layer 122 by implanting impurities (e.g., p-type) into the semiconductor substrate 110 at the radially inner and outer surfaces of the isolation region 120b using a PLAsma Doping (PLAD) ion implantation process.

In the manufacturing of the image sensor including the unit pixel 100b, surface defects could be caused in a region of the semiconductor substrate 110 adjacent to the isolation region 120b. Such surface defects could thermally generate electric charges even without any incident light. If left untreated, the surface defects could thus produce dark currents displayed on a display screen as a plurality of white spots. In the example of FIG. 6, electric charges generated by the surface defects are coupled with the holes in the surface doping layer 122. Thus, the surface defects are passivated and as a result, the magnitude of dark currents is minimal.

Alternatively, in the example shown in FIG. 1, the isolation region 120 may be filled with dielectric material including negative fixed charges to passivate the surface defects. In this case, the holes may be accumulated in the region adjacent to the isolation region 120 of the semiconductor substrate 110. Electric charges generated by surface defects may be coupled with the holes accumulated in the region adjacent to isolation region 120 of the semiconductor substrate 110. In this was, the surface defects are passivated and thus, the dark currents are minimized.

Figure 7:
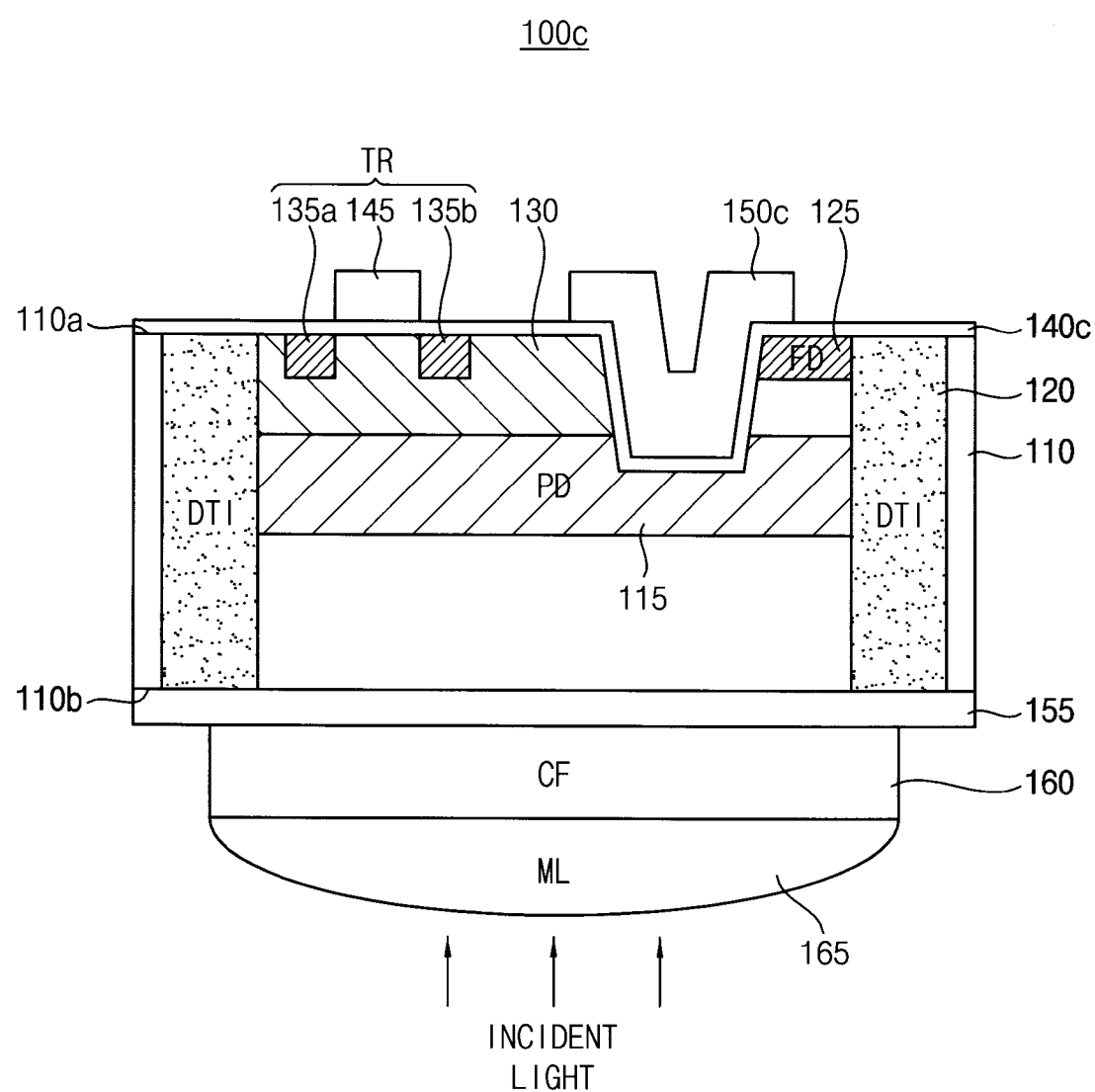
FIG. 7 is a cross-sectional view of another example of a unit pixel of an image sensor according to the inventive concept.

In the example shown in FIG. 7, a unit pixel 100c of an image sensor includes a photoelectric conversion region 115, an isolation region 120, a floating diffusion region 125 and a transfer gate 150c that are formed in a semiconductor substrate 110. The unit pixel 100c of the image sensor further includes a first impurity region 130, a second impurity region 135a, a third impurity region 135b, a first dielectric layer 140c, a first gate 145, a second dielectric layer 155, a color filter 160 and a micro lens 165.

As was mentioned earlier, in this example, a bottom portion of the transfer gate 150c, i.e., the deepest portion of the transfer gate 150c with respect to the front surface 110a of the semiconductor substrate 110, extends within with the photoelectric conversion region 115. To this end, an opening may be formed from the front surface 110a of the semiconductor substrate 110 to a midportion, for example, of the photoelectric conversion region 115. Then, the first dielectric layer 140c is formed on the front surface 110a of the semiconductor substrate 110, and the transfer gate 150c is formed on the first dielectric layer 140 including within that part of the opening in the photoelectric conversion region 115.

Figure 8:
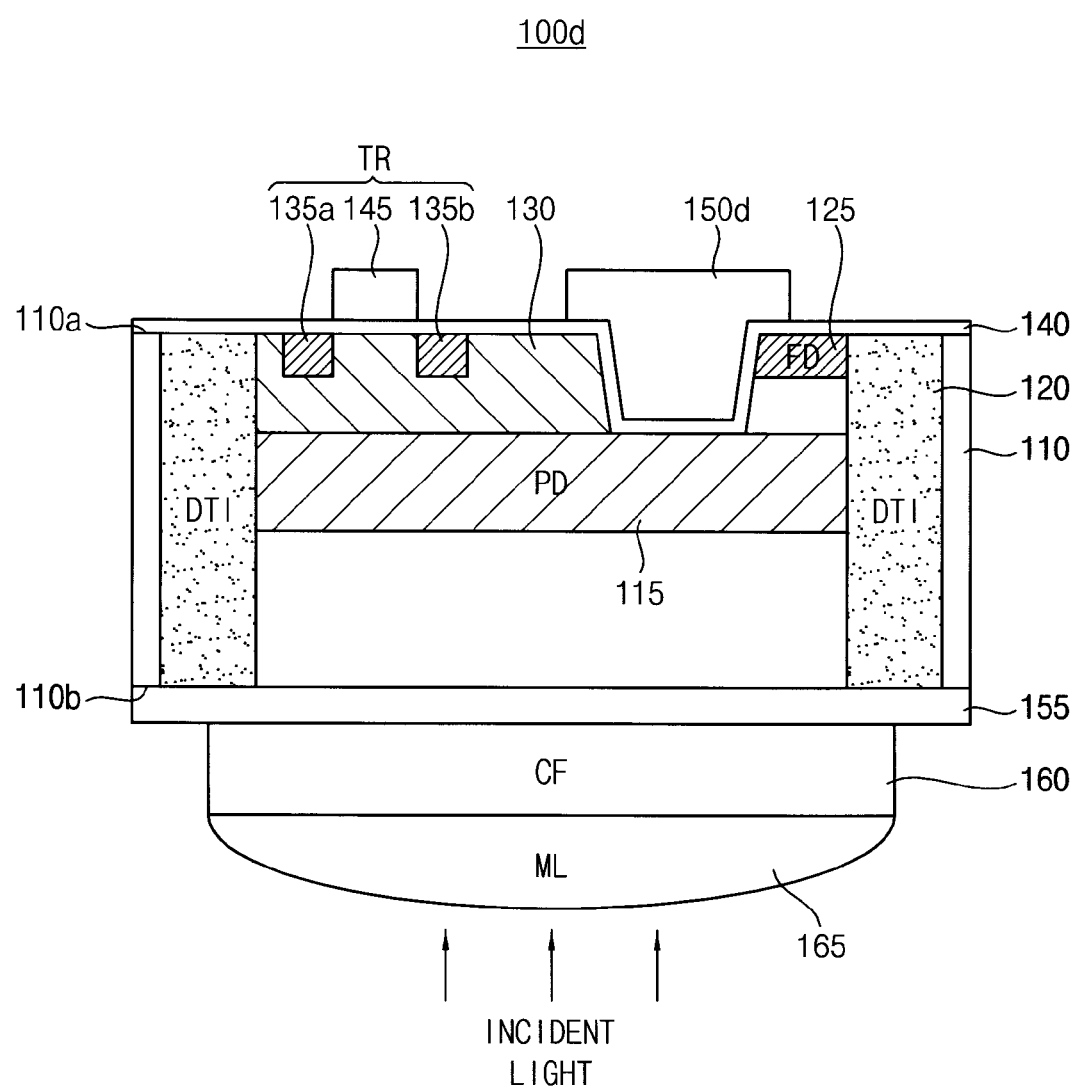
FIG. 8 is a cross-sectional view of another example of a unit pixel of an image sensor according to the inventive concept.

In the example shown in FIG. 8, a unit pixel 100d of an image sensor includes a photoelectric conversion region 115, an isolation region 120, a floating diffusion region 125 and a transfer gate 150d that are formed in a semiconductor substrate 110. The unit pixel 100d of the image sensor also includes a first impurity region 130, a second impurity region 135a, a third impurity region 135b, a first dielectric layer 140, a first gate 145, a second dielectric layer 155, a color filter 160 and a micro lens 165.

As was also mentioned earlier, in this example, the transfer gate 150d is pillar-shaped, e.g., has the form of a solid column. In this case, the transfer gate 150d is thicker than the first gate 145. Also, the first gate 145 and the transfer gate 150d may be formed using different processes. In this respect, the transfer gate 150d may be formed before or after the first gate 145.

Figure 9:
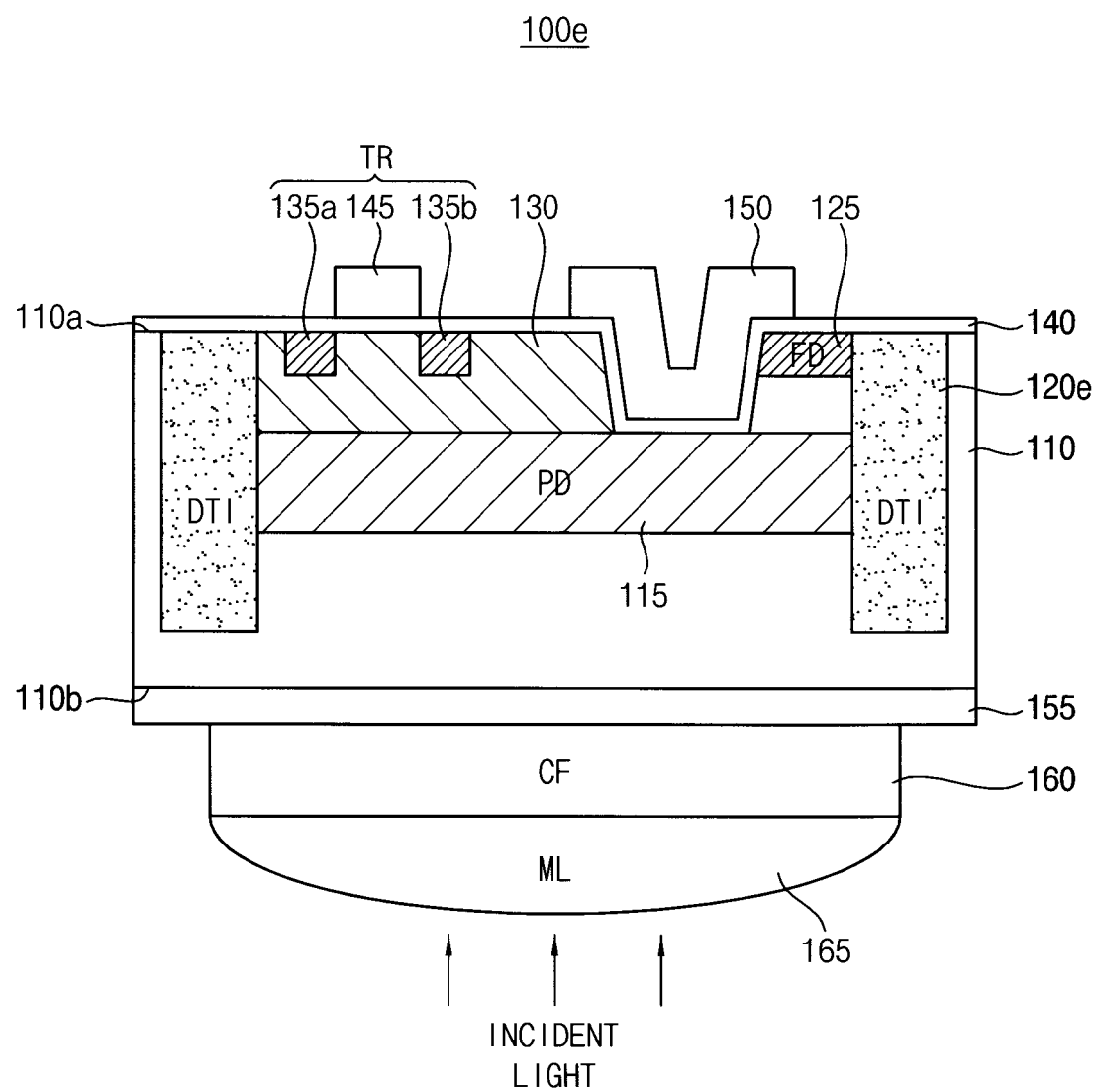
FIG. 9 is a cross-sectional view of another example of a unit pixel of an image sensor according to the inventive concept.

In the example shown in FIG. 9, a unit pixel 100e of an image sensor includes a photoelectric conversion region 115, an isolation region 120e, a floating diffusion region 125 and a transfer gate 150 that are formed in a semiconductor substrate 110. The unit pixel 100e of the image sensor also includes a first impurity region 130, a second impurity region 135a, a third impurity region 135b, a first dielectric layer 140, a first gate 145, a second dielectric layer 155, a color filter 160 and a micro lens 165.

In this example as was also mentioned earlier, the isolation region 120e does not extend throughout the entire thickness of the semiconductor substrate 110. That is, the height of the vertical isolation region 120e is less than the thickness of the semiconductor substrate 110. In particular, the isolation region 120e may be formed from the front surface 110a of the semiconductor substrate 110 to a depth below the level of the back surface of the photoelectric conversion region 115 (bottom surface in the figure) but above the back surface 110b of the semiconductor substrate 110.

Figure 10:
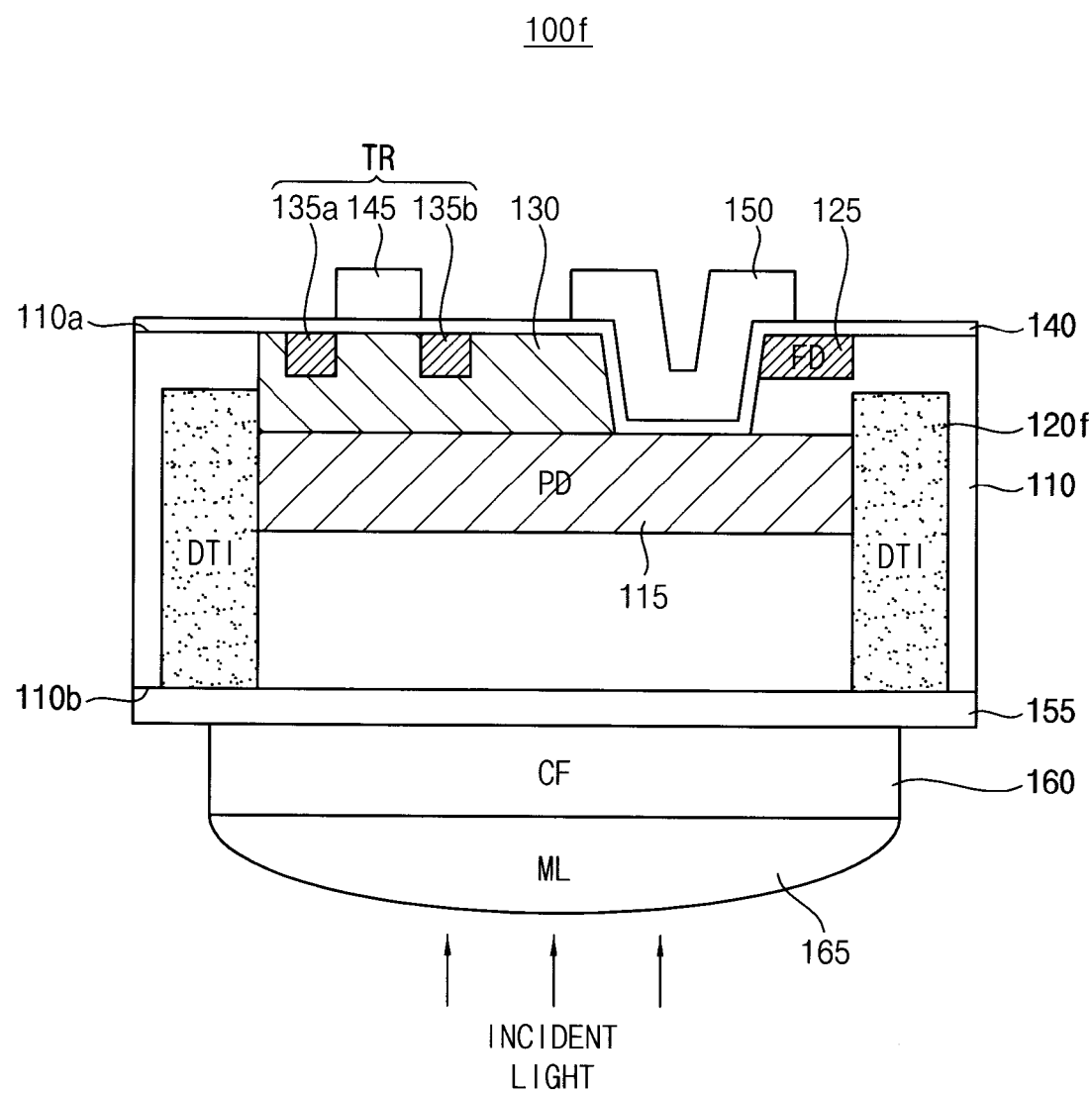
FIG. 10 is a cross-sectional view of another example of a unit pixel of an image sensor according to the inventive concept.

In the example shown in FIG. 10, a unit pixel 100f of an image sensor includes a photoelectric conversion region 115, an isolation region 120f, a floating diffusion region 125 and a transfer gate 150 that are formed in a semiconductor substrate 110. The unit pixel 100f of the image sensor also includes a first impurity region 130, a second impurity region 135a, a third impurity region 135b, a first dielectric layer 140, a first gate 145, a second dielectric layer 155, a color filter 160 and a micro lens 165.

In this example, as well, the isolation region 120f has a height that is less than the thickness of the semiconductor substrate 110. However, in this example, the isolation region 120f is formed from the back surface 110b of the semiconductor substrate 110 after the transfer gate 150 is formed, and to a depth at a level above the back surface of the photoelectric conversion region 115 (in the orientation depicted in the figure) but such that it does not contact the front surface 110a of the semiconductor substrate 110.

Figure 11:
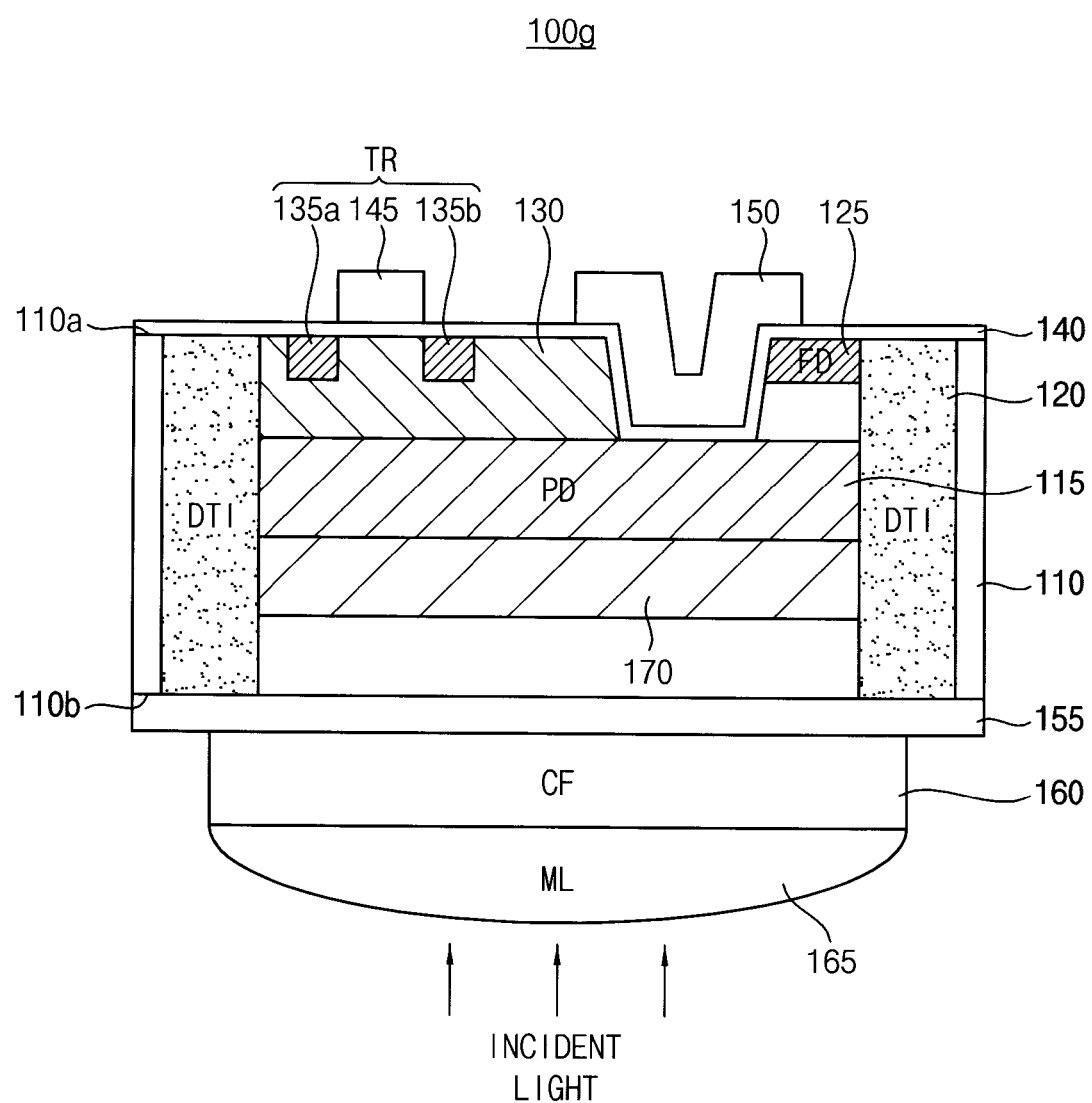
FIG. 11 is a cross-sectional view of another example of a unit pixel of an image sensor according to the inventive concept.

In the example shown in FIG. 11, a unit pixel 100g of an image sensor includes a photoelectric conversion region 115, an isolation region 120, a floating diffusion region 125 and a transfer gate 150 that are formed in a semiconductor substrate 110. The unit pixel 100g of the image sensor also includes a first impurity region 130, a second impurity region 135a, a third impurity region 135b, a fourth impurity region 170, a first dielectric layer 140, a first gate 145, a second dielectric layer 155, a color filter 160 and a micro lens 165.

The fourth impurity region 170 is formed in the semiconductor substrate 110 under the photoelectric conversion region 115 and within the unit pixel area UPA. The photoelectric conversion region 115 may be a region of the substrate doped with second conductivity-type (e.g., n-type) impurities, and at a lower density (concentration) than the photoelectric conversion region 115. For example, an (n−)-type region may be formed in the semiconductor substrate 110 under the photoelectric conversion region 115 using an ion implantation process to form the fourth impurity region 170.

As should be clear, a unit pixel according to the inventive concept may have any combination of features described above with reference to FIGS. 1, 5, 6, 7, 8, 9, 10 and 11. That is, a unit pixel of an image sensor according to the inventive concept may include the polysilicon region of the example of FIG. 5, may include the surface doping layer of the example of FIG. 6, may include a transfer gate having any of the various shapes shown in and described with reference to FIGS. 1, 7 and 8, may include any form of the isolation region shown in and described with reference to FIGS. 1, 9 and 10, and may also include an additional impurity region as shown in and described with reference to FIG. 11.

Figure 12:
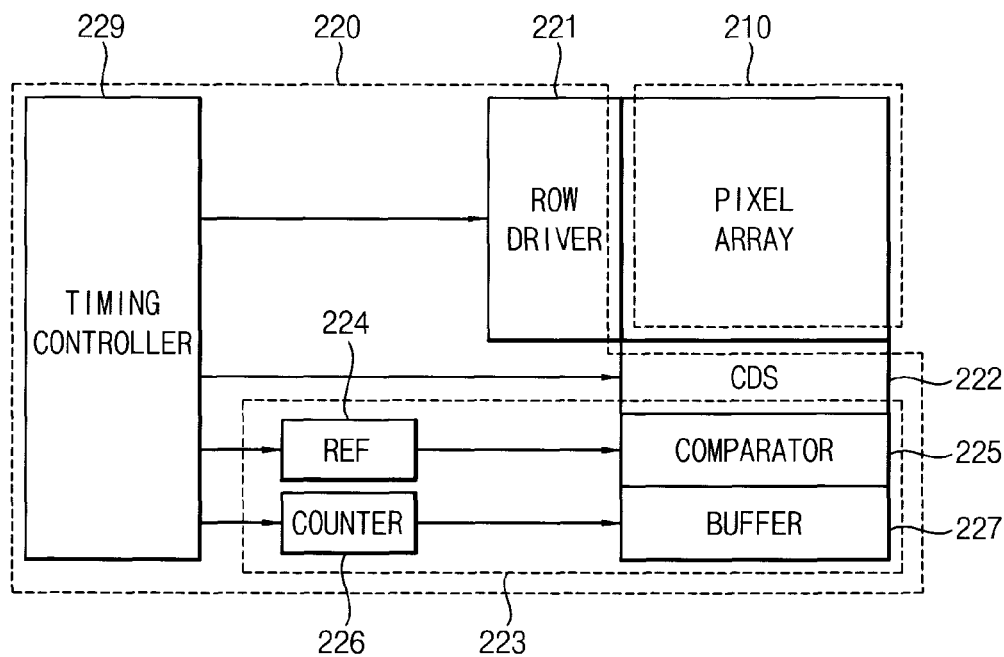
FIG. 12 is a block diagram of an embodiment of an image sensor according to the inventive concept.

An embodiment of an image sensor 200, including a unit pixel, according to the inventive concept will now be described with reference to FIG. 12.

The image sensor 200 includes a pixel array 210 and a signal processing unit 220.

The pixel array 210 generates electric signals from light incident thereon. The pixel array 210 includes unit pixels according to the inventive concept as described above, and may be a matrix of the unit pixels. Accordingly, the fill factor of the image sensor 200 is high due to the relatively deep photoelectric conversion regions 115 of the unit pixels which allows for a three-dimensional arrangement of the photoelectric conversion regions 115, the floating diffusion regions 125 and the transistors. In addition, the photo-charges generated from the photoelectric conversion region 115 may be efficiently transmitted to the floating diffusion region 125 through the transfer gate 150 because the transfer gate 150 extends substantially vertically with respect to (i.e., substantially perpendicular to) the front surface 110a of the semiconductor substrate 110. The SNR of the image sensor 200 is optimal because undesirable optical and/or electrical crosstalk are efficiently prevented by the isolation region 120 which extends substantially vertically with respect to (i.e., substantially perpendicular to) the front surface 110a of the semiconductor substrate 110 and across the incident (e.g., back) side of the photoelectric conversion region 115.

The signal processing unit 220 generates image data based on the electric signals. To this end, the signal processing unit 220 may include a row driver 221, a correlated double sampling (CDS) unit 222, an analog-to-digital converting (ADC) unit 223 and a timing controller 229.

The row driver 221 is connected with each row of the pixel array 210 so as to issue driving signals to drive the rows. For example, the row driver 221 may drive the plurality of unit pixels row by row in the pixel array 210.

The CDS unit 222 performs a CDS operation (e.g., analog double sampling (ADS)) by obtaining a difference between reset components and measured signal components using capacitors and switches, and outputs analog signals corresponding to effective signal components. To this end, the CDS unit 222 may include a plurality of CDS circuits that are connected to columns, respectively. The CDS unit 222 may output the analog signals corresponding to the effective signal components column by column.

The ADC unit 223 converts the analog signals corresponding to the effective signal components into digital signals. To this end, the ADC unit 223 may include a reference signal generator 224, a comparison unit 225, a counter 226 and a buffer unit 227. The reference signal generator 224 may generate a reference signal (e.g., a ramp signal having a slope), and provide the reference signal to the comparison unit 225. The comparison unit 225 may compare the reference signal with the analog signals corresponding to the effective signal components, and output comparison signals having respective transition timings according to respective effective signal components column by column. The counter 226 may perform a counting operation to generate a counting signal, and provide the counting signal to the buffer unit 227. The buffer unit 227 may include a plurality of latch circuits respectively connected to the column lines. The buffer unit 227 may latch the counting signal of each column line in response to the transition of each comparison signal, and output the latched counting signal as the image data.

In an example of this embodiment, the ADC unit 223 further includes an adder circuit that adds the analog signals output from the CDS unit 222. The buffer unit 227 may include a plurality of single line buffers.

The timing controller 229 controls the timing of the operation of the row driver 221, the CDS unit 222, and the ADC unit 223. In this respect, the timing controller 229 may provide timing signals and control signals to the row driver 221, the CDS unit 222, and the ADC unit 223.

Furthermore, the image sensor 200 may perform a digital double sampling (DDS) as the CDS. In DDS, the reset signal and the measured image signal are both converted to respective digital signals. The final image signal can be determined from a difference of such respective digital signals.

Figure 13:
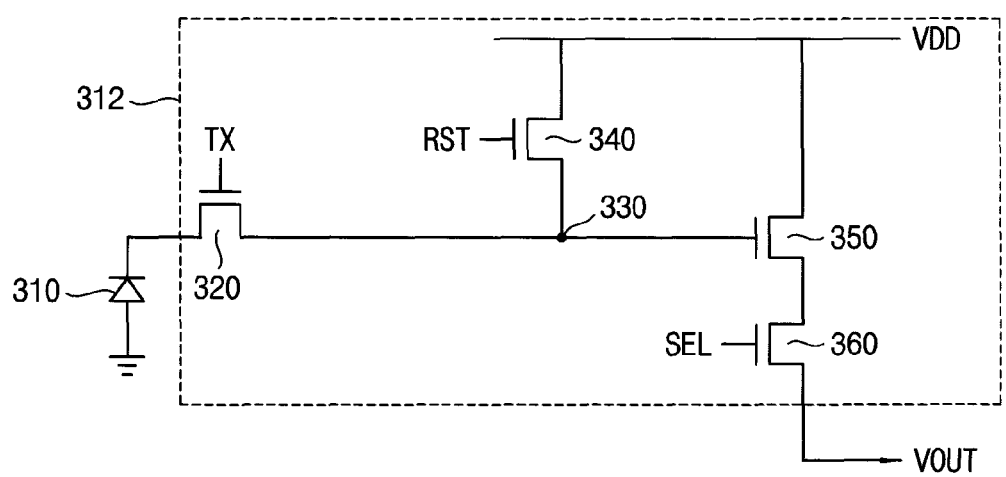
FIG. 13 is a circuit diagram illustrating an equivalent circuit of a unit pixel of the image sensor of FIG. 12.

An example of an equivalent circuit 300 of a unit pixel included in the image sensor of FIG. 12 will now be described with reference to FIG. 13.

The unit pixel may include a photoelectric conversion unit 310 and a signal generation unit 312.

The photoelectric conversion unit 310 performs a photoelectric conversion operation. For example, the photoelectric conversion unit 310 converts incident light into photo-charges during a first operation mode, e.g., an integration mode. If the unit pixel is part of a CMOS image sensor, image information on an object to be captured is obtained by collecting charge carriers (e.g., electron-hole pairs) in the photoelectric conversion unit 310 proportional to intensity of incident light passing through an open shutter of the CMOS image sensor, during the integration mode.

The signal generation unit 312 generates an electric signal based on the photo-charges generated by the photoelectric conversion operation during a second operation mode, e.g., a readout mode. Again, in the case of a CMOS image sensor, the shutter is closed, the image information in a form of charge carriers is converted into the electric signals, and the image data is generated based on the electric signals, during the readout mode after the integration mode.

As was mentioned above, a unit pixel according to the inventive concept may have a one-transistor structure, three-transistor structure, four-transistor structure, five-transistor structure, etc. In the example illustrate in FIG. 13, the unit pixel has a four-transistor structure. In this case, the signal generation unit 312 includes a transfer transistor 320, a reset transistor 340, a drive transistor 350, a select transistor 360 and a floating diffusion node 330. The floating diffusion node 330 corresponds to the floating diffusion region and may be connected to a capacitor (not shown).

The transfer transistor 320 includes a first electrode connected to the photoelectric conversion unit 310, a second electrode connected to the floating diffusion node 330, and a gate electrode to which a transfer signal TX is applied. The reset transistor 340 includes a first electrode to which a power supply voltage VDD is applied, a second electrode connected to the floating diffusion node 330, and a gate electrode to which a reset signal RST is applied. The drive transistor 350 includes a first electrode to which the power supply voltage VDD is applied, a gate electrode connected to the floating diffusion node 230, and a second electrode. The select transistor 360 includes a first electrode connected to the second electrode of the drive transistor 350, a gate electrode to which a select signal SEL is applied, and a second electrode providing an output voltage VOUT.

Hereinafter, an operation of the image sensor 200 will be described with reference to FIGS. 12 and 13.

When the reset transistor 340 is turned on by raising a voltage level of a gate RST of the reset transistor 340, a voltage level of the floating diffusion node 330, which is a sensing node, increases up to the power supply voltage VDD.

When external light is incident onto the photoelectric conversion unit 310 during the integration mode, electron-hole pairs are generated in proportion to the amount of incident light.

When a voltage level of a gate TX of the transfer transistor 320 increases during the readout mode after the integration mode, electrons integrated within the photoelectric conversion unit 310 are transferred to the floating diffusion node 330 through the transfer transistor 320. The electric potential of the floating diffusion node 330 drops in proportion to the amount of the transferred electrons, and then the electric potential of the source in the drive transistor 350 is varied depending on the amount of the transferred electrons.

When the select transistor 360 is turned on by raising a voltage level of a gate SEL of the selection transistor 360, the electric potential of the floating diffusion node 330 is transferred, as an output signal, through the drive transistor 350. The unit pixel 300 outputs the electric signal VOUT corresponding to the information of an object whose image is to be captured, and the signal processing unit 220 generates image data based on the electric signals VOUT.

Figure 14:
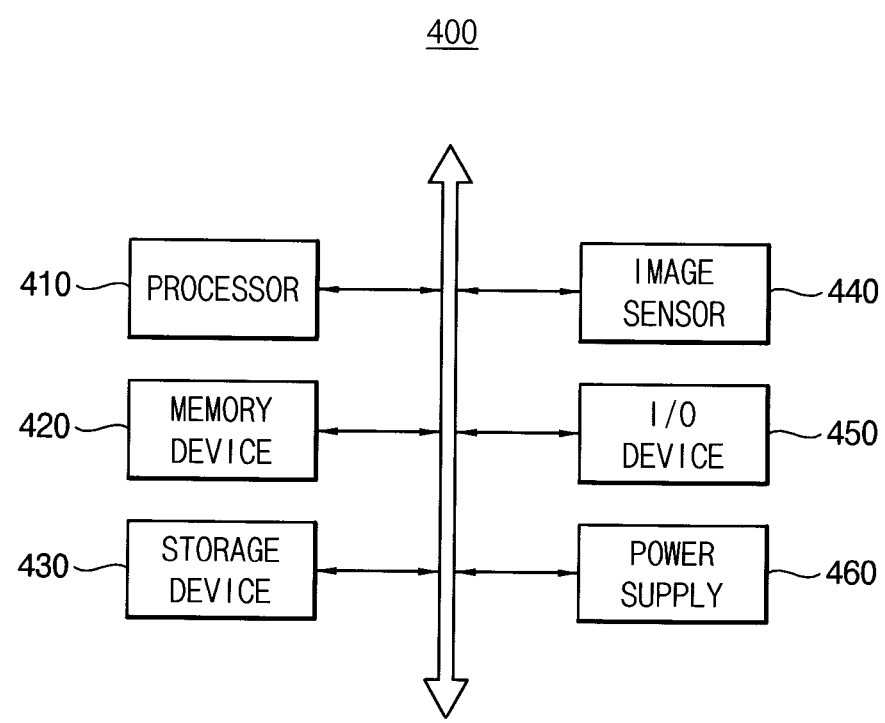
FIG. 14 is a block diagram of a computing system having an image sensor according to the inventive concept.

An embodiment of a computing system 400, having an image sensor, according to the inventive concept will now be described with reference to FIG. 14.

The computing system 400 includes a processor 410, a memory device 420, a storage device 430, an input/output (I/O) device 450, a power supply 460 and an image sensor 440. Although not illustrated in FIG. 14, the computing system 400 may further include a plurality of ports for communicating with a video card, a sound card, a memory card, a universal serial bus (USB) device and/or other electric devices.

The processor 410 may perform various computing functions. The processor 410 may be a micro processor and/or a central processing unit (CPU). The processor 410 may be connected to the memory device 420, the storage device 430, and the I/O device 450 via at least one bus, e.g., an address bus, a control bus, and/or a data bus. The processor 410 may be connected to an extended bus, e.g., a peripheral component interconnection (PCI) bus.

The memory device 420 may store data for operating the computing system 400. For example, the memory device 420 may include a dynamic random access memory (DRAM), a static random access memory (SRAM), an erasable programmable read-only memory (EPROM), an electrically erasable programming read-only memory (EEPROM) and/or a flash memory.

The storage device 430 may include a solid state drive device, a hard disk drive and/or a CD-ROM. The I/O device 450 may include input devices, e.g., a keyboard, a keypad and/or a mouse, and output devices, e.g., a printer and/or a display device. The power supply 460 may provide power for operating all of the components of the computing system 400.

The image sensor 440 may communicate with the processor 410 via the bus or another communication link(s). The image sensor 440 may be of the type described above with reference to FIGS. 12 and 13 and in any case, includes unit pixels according to the inventive concept. Thus, the image sensor 440 may have all of the advantages described above with respect to the image sensor 200.

Furthermore, the computing system 400 or select components of the computing system 400 may be integrated and/or packaged in various ways.

With respect to the former, for example, the image sensor 440 and the processor 410 may be fabricated as one integrated circuit chip. However, the image sensor 440 and the processor 410 may be fabricated as two separate integrated circuit chips.

With respect to the latter, the computing system 400 or select components of the computing system 400 may be assembled as part of a package on package (PoP), ball grid array (BGA) package, chip scale package (CSP), plastic leaded chip carrier (PLCC), plastic dual in-line package (PDIP), die in waffle pack, die in wafer form, chip on board (COB) package, ceramic dual in-line package (CERDIP), plastic metric quad flat pack (MQFP), thin quad flat pack (TQFP), small outline IC (SOIC) package, shrink small outline package (SSOP), thin small outline package (TSOP), system in package (SIP), multi-chip package (MCP), wafer-level fabricated package (WFP), or wafer-level processed stack package (WSP).

Figure 15:
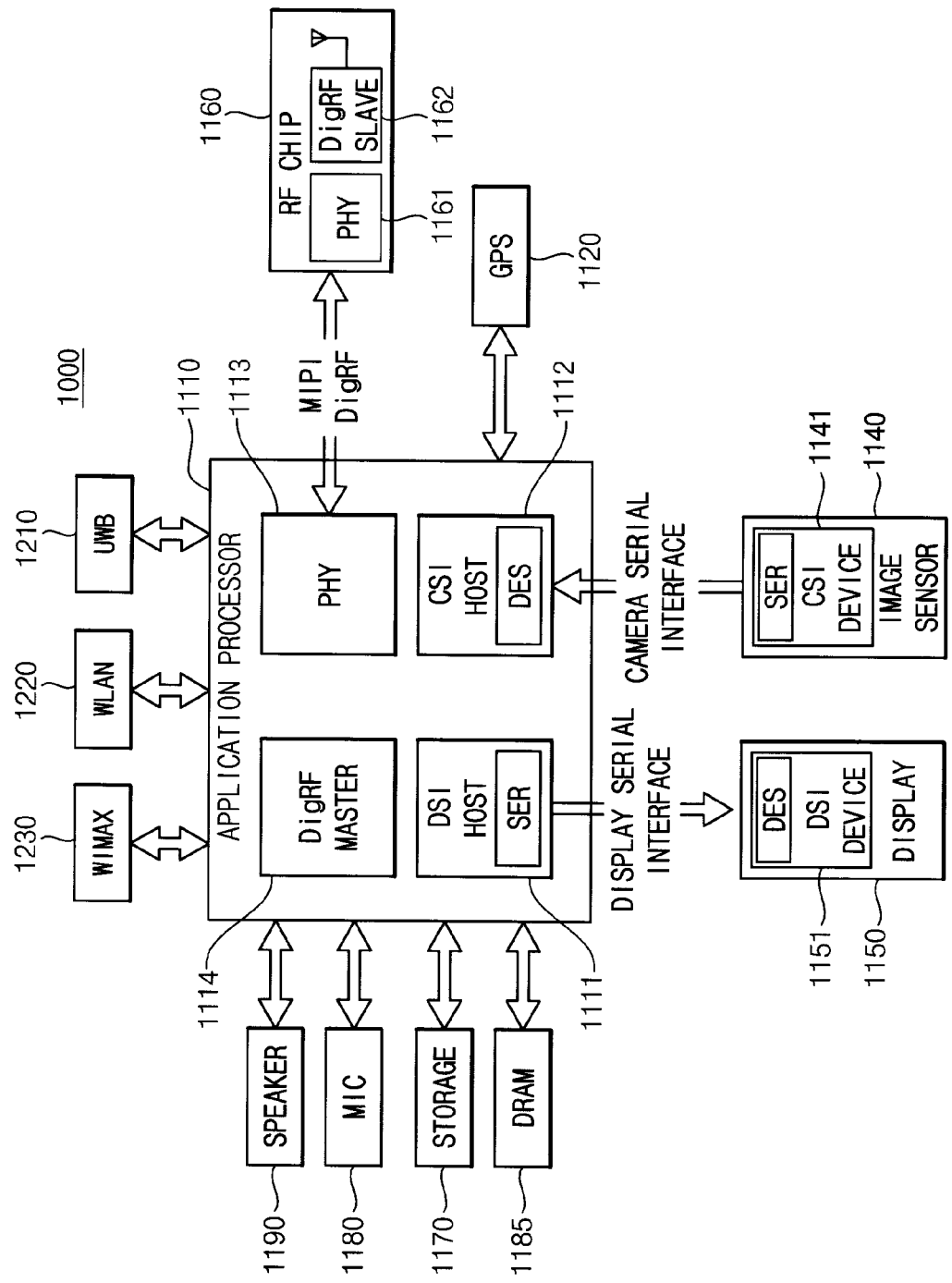
FIG. 15 is a block diagram of an example of a computing system having an image sensor, according to the inventive concept, and it interface.

Next, a more detailed example of a computing system 1000 having an image sensor, according to the inventive concept, will be described with reference to FIG. 15.

The computing system 1000 may be a data processing device that uses or supports a mobile industry processor interface (MIPI) (e.g., a mobile phone, a personal digital assistant (PDA), a portable multimedia player (PMP), and/or a smart phone). The computing system 1000 includes an application processor 1110, an image sensor 1140 and a display device 1150.

A CSI host 1112 of the application processor 1110 may perform a serial communication with a CSI device 1141 of the image sensor 1140 using a camera serial interface (CSI). In this example, the CSI host 1112 includes a light deserializer (DES), and the CSI device 1141 includes a light serializer (SER). A DSI host 1111 of the application processor 1110 may perform a serial communication with a DSI device 1151 of the display device 1150 using a display serial interface (DSI). Again, in this example, the DSI host 1111 includes a light serializer (SER), and the DSI device 1151 includes a light deserializer (DES).

The computing system 1000 also includes a radio frequency (RF) chip 1160. The RF chip 1160 communicates with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1000 may also include a global positioning system (GPS) 1120, a storage device 1170, a MIC 1180, a DRAM device 1185, and a speaker 1190. In addition, the computing system 1000 may perform communications using an ultra wideband (UWB) 1220, a wireless local area network (WLAN) 1220 and/or a worldwide interoperability for microwave access (WIMAX) 1230. However, the computing system 1000 is not limited to having these particular components and interfaces as variations thereof will be apparent to those of ordinary skill in the art.

Finally, an image sensor according to the inventive concept, and an electronic system employing such an image sensor, may be employed by various electronic devices or sub-systems of electronic devices such as a computer, a digital camera, a 3-D camera, a cellular phone, a personal digital assistant (PDA), a scanner, a navigation system, a video phone, a surveillance system, an auto-focusing system, a tracking system, a motion-sensing system or an image-stabilization system.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A pixel unit comprising:
   a semiconductor substrate having first and second opposite major surfaces at upper and lower portions thereof, respectively;
   a photoelectric conversion region within the semiconductor substrate;
   an isolation region comprising dielectric material surrounding the photoelectric conversion region, and wherein the dielectric material extends substantially vertically in an axial direction away from the first surface of the semiconductor substrate to the level of the second surface of the semiconductor substrate in the pixel unit, the dielectric material has an end surface coplanar with the second surface of the semiconductor substrate, and an entire outer circumferential portion of the photoelectric conversion region contacts the isolation region; and
   a transfer gate extending substantially vertically in the axial direction away from the first surface of the semiconductor substrate to a location adjacent the photoelectric conversion region.

2. The pixel unit of claim 1, wherein the dielectric material has a refractive index lower than that of the semiconductor substrate.

3. The pixel unit of claim 2, further comprising a polysilicon region within the dielectric material of the isolation region.

4. The pixel unit of claim 2, wherein the semiconductor substrate contains impurities of a conductivity type, and further comprising a doped surface layer surrounding the dielectric material of the isolation region, and wherein the doped surface layer contains impurities of the opposite conductivity type as the photoelectric conversion region but at a higher density.

5. The pixel unit of claim 2, wherein the dielectric material contains negative fixed charges.

6. The pixel unit of claim 1, wherein part of the transfer gate extends into the photoelectric conversion region.

7. The pixel unit of claim 1, wherein the transfer gate is cup-shaped or pillar-shaped.

8. The pixel unit of claim 1, further comprising a first impurity region under the photoelectric conversion region, the photoelectric conversion region containing impurities of a first-conductivity type, and the first impurity region containing the same type of impurities as the photoelectric conversion region but at a lower density than the photoelectric conversion region.

9. The pixel unit of claim 1, further comprising:
   a color filter disposed on the second surface of the semiconductor substrate.

10. The pixel unit of claim 9, further comprising:
    a dielectric layer interposed between the second surface of the semiconductor substrate and the color filter.

11. The pixel unit of claim 10, wherein the dielectric layer includes negative fixed charges.

12. The pixel unit of claim 1, wherein the photoelectric conversion region has impurities of a first conductivity type and is spaced from the first surface of the semiconductor substrate towards the second surface of the semiconductor substrate.

13. The pixel unit of claim 9, further comprising:
    a micro lens disposed on the color filter.

14. The pixel unit of claim 13, wherein the micro lens is a convex lens having such a curvature that light incident on the micro lens is focused through the color filter and onto the photoelectric conversion region by the micro lens.

15. The pixel unit of claim 1, wherein the photoelectric conversion region collects photo-charges in response to incident light, and configured such that a leakage component of the incident light is reflected internally at a sidewall surface of the isolation region, and a reflection component of the incident light reaches the photoelectric conversion region.

* * * * *